(12) United States Patent
Kumar et al.

(10) Patent No.: US 9,075,930 B2
(45) Date of Patent: Jul. 7, 2015

(54) CONFIGURABLE EMBEDDED MEMORY SYSTEM

(71) Applicant: Xilinx, Inc., San Jose, CA (US)

(72) Inventors: Subodh Kumar, San Jose, CA (US); James M. Simkins, Park City, UT (US); Thomas H. Strader, Corona, CA (US); Matthew H. Klein, Redwood City, CA (US); James E. Ogden, Tracy, CA (US); Uma Durairajan, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 420 days.

(21) Appl. No.: 13/673,892

(22) Filed: Nov. 9, 2012

(65) Prior Publication Data

US 2014/0133246 A1 May 15, 2014

(51) Int. Cl.
  *G11C 7/10* (2006.01)
  *G06F 13/42* (2006.01)
  *H03K 19/177* (2006.01)
  *G11C 16/26* (2006.01)

(52) U.S. Cl.
  CPC .......... *G06F 13/4234* (2013.01); *G11C 7/1006* (2013.01); *H03K 19/17732* (2013.01); *H03K 19/1776* (2013.01); *G11C 7/1039* (2013.01); *G11C 7/1069* (2013.01); *G11C 7/1096* (2013.01); *G11C 2207/104* (2013.01); *G11C 16/26* (2013.01); *Y02B 60/1228* (2013.01); *Y02B 60/1235* (2013.01)

(58) Field of Classification Search
  CPC ..................................................... G11C 7/1006
  USPC .............................................. 365/189.02, 51
  See application file for complete search history.

(56) References Cited

U.S. PATENT DOCUMENTS

| | | | |
|---|---|---|---|
| 5,327,129 A * | 7/1994 | Soenen et al. | 341/120 |
| 6,178,472 B1 * | 1/2001 | Carpenter et al. | 710/54 |
| 7,187,203 B1 | 3/2007 | Hume et al. | |
| 7,746,112 B1 | 6/2010 | Gaide et al. | |

* cited by examiner

*Primary Examiner* — Huan Hoang
*Assistant Examiner* — Jay Radke
(74) *Attorney, Agent, or Firm* — W. Eric Webostad

(57) ABSTRACT

An embodiment of a memory module is disclosed. This memory module is a configurable hard macro. A portion of this memory module includes a data input multiplexer coupled to select between cascaded data and direct/bused data. Such portion further includes, a memory coupled to receive output from the data input multiplexer for storage therein, and a register input multiplexer coupled to select between read data from the memory and the cascaded data. This memory module further includes: a register coupled to receive output from the register input multiplexer, a latch/register mode multiplexer coupled to select between the read data from the memory and registered data from the register, and a data output multiplexer coupled to select between the cascaded data and output from the latch/register mode multiplexer to provide output data.

17 Claims, 23 Drawing Sheets

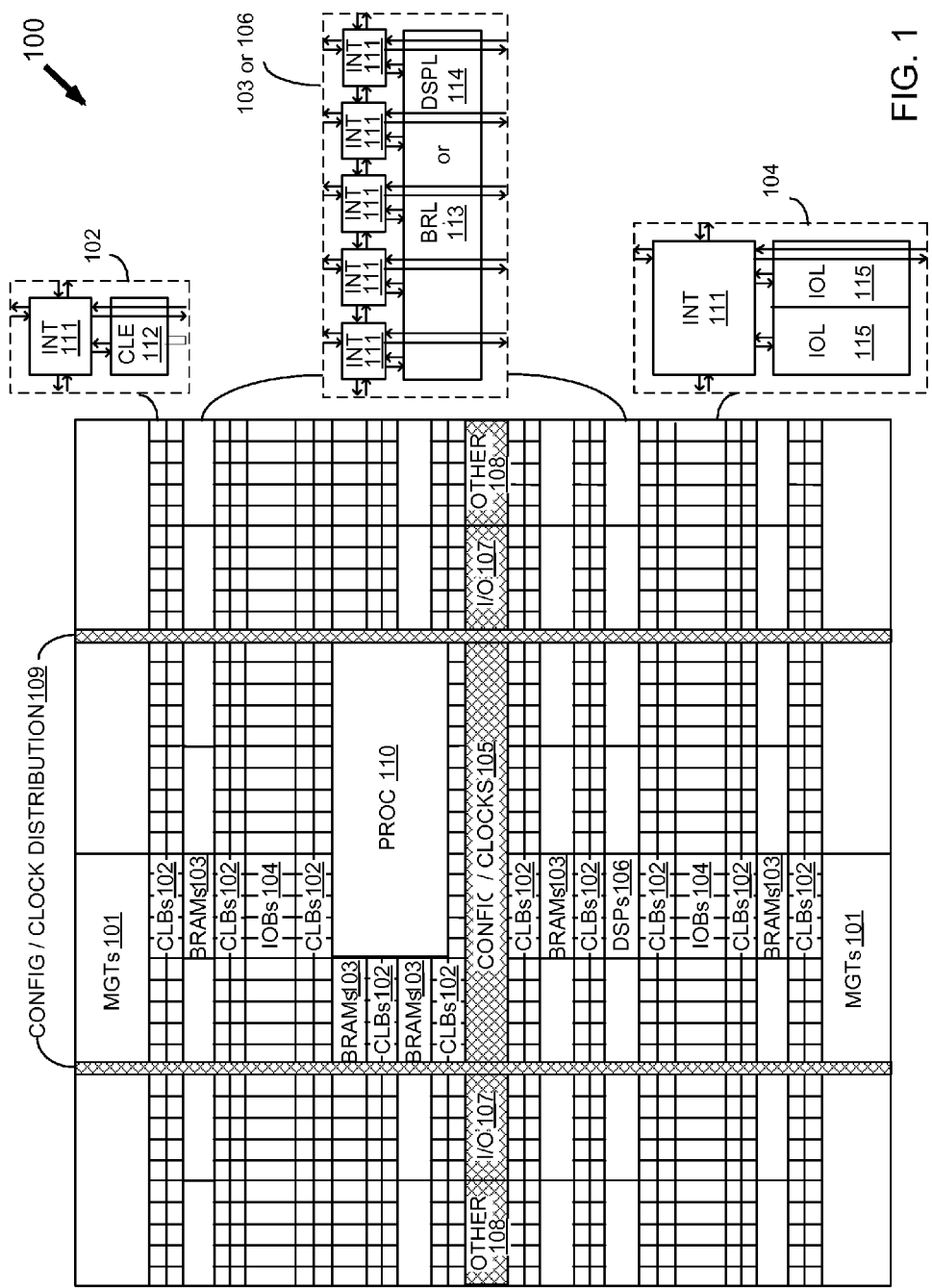

| Data resides in | EN3 | EN2 | EN1 | EN0 | S3 | S2 | S1 | S0 |
|---|---|---|---|---|---|---|---|---|
| BRAM3 | 1 | 0 | 0 | 0 | 1 | X | X | X |
| BRAM2 | 0 | 1 | 0 | 0 | 0 | 1 | X | X |
| BRAM1 | 0 | 0 | 1 | 0 | 0 | 0 | 1 | X |
| BRAM0 | 0 | 0 | 0 | 1 | 0 | 0 | 0 | 1 |

CONFIGURABLE EMBEDDED MEMORY SYSTEM

FIELD OF THE INVENTION

An embodiment relates to integrated circuit devices ("ICs"). More particularly, an embodiment relates to a configurable embedded memory system for an IC.

BACKGROUND

IC's have become more "dense" over time, i.e., more logic features have been implemented in an IC of a given size. Therefore, power consumption has become an increasingly more significant issue. Furthermore, applications have become more demanding of speed over time. Therefore, frequency of operation has become an increasingly more significant issue. Hence, it is desirable and useful to provide an IC having reduced power consumption and/or higher performance.

SUMMARY

One or more apparatuses generally relate to a configurable embedded memory system for an IC.

An apparatus relates generally to a memory module. This memory module is a configurable hard macro. A portion of this memory module includes a data input multiplexer coupled to select between cascaded data and direct/bused data. Such portion further includes, a memory coupled to receive output from the data input multiplexer for storage therein, and a register input multiplexer coupled to select between read data from the memory and the cascaded data. Such portion yet further includes: a register coupled to receive output from the register input multiplexer, a latch/register mode multiplexer coupled to select between the read data from the memory and registered data from the register, and a data output multiplexer coupled to select between the cascaded data and output from the latch/register mode multiplexer to provide output data.

Another apparatus generally relates to a memory module. This memory module is a configurable hard macro. In such memory module, included is a plurality of data-in multiplexers each having a data-in input port, a first cascade input port, a cascade/data-in select port, and a write data output port. A plurality of memory blocks each have a write data input port, a first clock port, and a read data output port. A plurality of pipeline multiplexers each have a first read data input port, a second cascade input port, a pipeline select port, and a register data output port. A plurality of registers each have a register data input port, a registered data output port, and a second clock port. A plurality of data-out multiplexers each have a second read data input port, a registered data input port, a registered/unregistered select port, and a block output port. A plurality of control multiplexers each having a third cascade input port, a block input port, a control select port, and a data-out port.

Yet another apparatus generally relates to a first and a second memory module. Such a first memory module is provided as a first configurable hard macro, and such a second memory module is provided as a second configurable hard macro. The first memory module is at a higher level of a stack than the second memory module. The first memory module has a first upper memory block and a first lower memory block separate from one another. The second memory module has a second upper memory block and a second lower memory block. A first cascade input node of the first memory module associated with the first upper memory block is coupled to a first data-out node of the second memory module associated with the second upper memory block to provide a first memory column including the first upper memory block and the second upper memory block. A second cascade input node of the first memory module associated with the first lower memory block is coupled to a second data-out node of the second memory module associated with the second lower memory block to provide a second memory column including the first lower memory block and the second lower memory block.

BRIEF DESCRIPTION OF THE DRAWINGS

Accompanying drawings show exemplary embodiments. However, the accompanying drawings should not be taken to limit the embodiments shown, but are for explanation and understanding only.

FIG. 1 is a simplified block diagram depicting an exemplary embodiment of a columnar Field Programmable Gate Array ("FPGA") architecture.

FIG. 3-1 is a block/circuit diagram depicting an exemplary upper or lower portion of a random access memory block ("BRAM") module.

FIG. 3-2 is a block diagram depicting an exemplary cascade control block.

FIG. 5 is a table diagram depicting an exemplary decoding table.

FIG. 12-1 is the block/circuit diagram of FIG. 10 depicting an exemplary low-power register mode having a data path as generally indicated by thick black lines.

FIG. 12-2 is the same block/circuit diagram as FIG. 12-1, except the data path is initiated at a register of a lowermost BRAM module of a stack and is cascaded upward from such register.

FIG. 13-1 is the block/circuit diagram of FIG. 10 depicting an exemplary latch mode having a data path as generally indicated with thick black lines.

FIG. 13-2 is the same block/circuit diagram as FIG. 13-1, except the data path is initiated at a BRAM block of a lowermost BRAM module of a stack and is cascaded upward from such BRAM block.

FIG. 14-1 is the block/circuit diagram of FIG. 10 depicting an exemplary multistage register mode having a data path 1400 as generally indicated with thick black lines.

FIG. 14-2 is the same block/circuit diagram as FIG. 14-1, except the data path is initiated at a BRAM block of a lowermost BRAM module of a stack and is cascaded upward from such BRAM block.

FIG. 17-1 is the block/circuit diagram of FIG. 10 depicting another exemplary vector mode, namely a "shift vector mode," having a data path as generally indicated with thick black lines.

FIG. 17-2 is the block/circuit diagram of FIG. 17-1 depicting another configuration for a shift vector mode for a data path 1700 as generally indicated with thick black lines.

DETAILED DESCRIPTION

Figure 2:
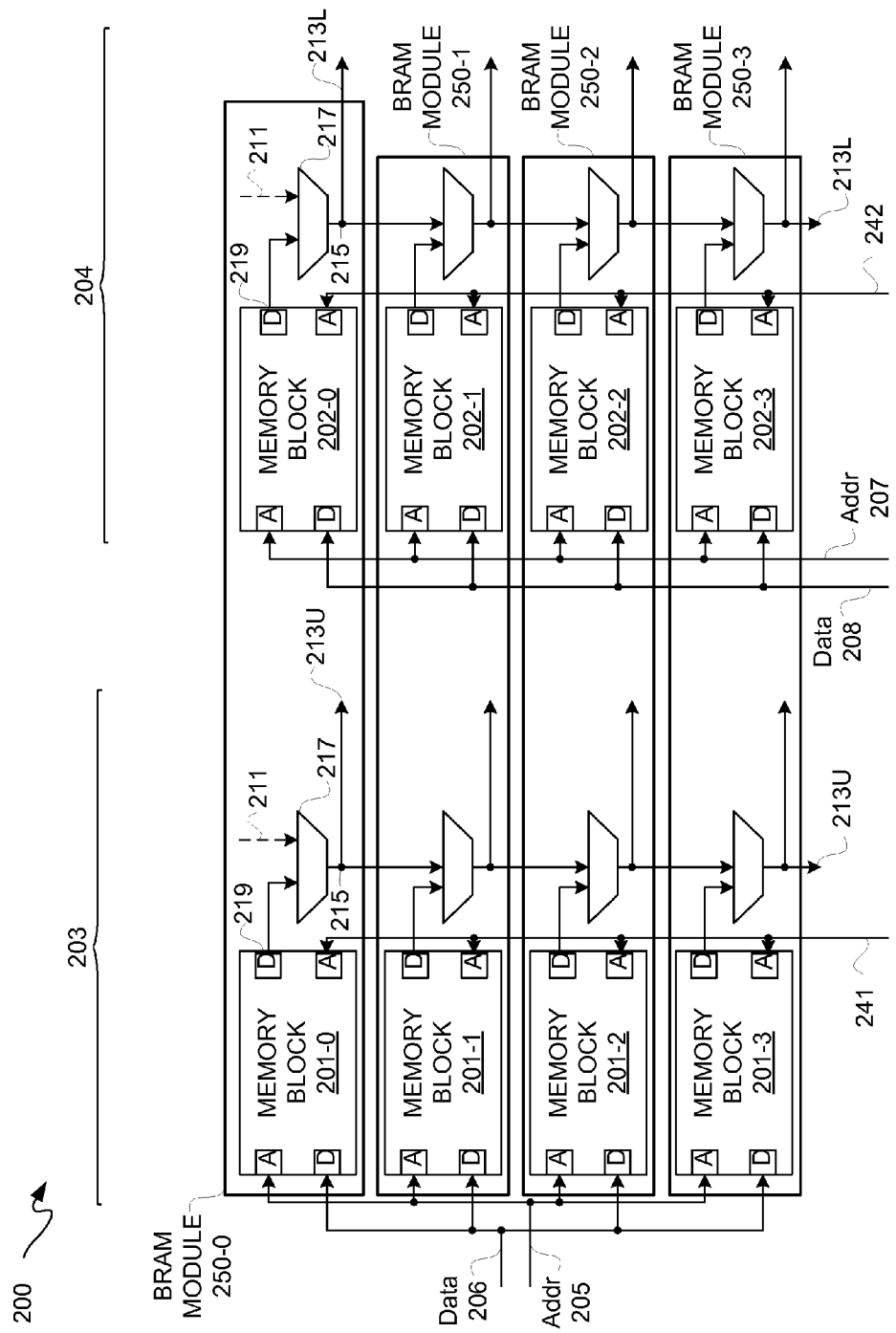
FIG. 2 is a block diagram depicting an exemplary memory system of an IC chip.

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure the one or more embodiments. For ease of illustration, the same number labels are used in different diagrams to refer to the same items; however, in alternative embodiments the items may be different.

Before describing exemplary embodiments illustratively depicted in the several figures, a general introduction is provided to further understanding.

Using dedicated memory modules in an IC in the past may have meant complex routing, which undermined performance. Furthermore, using such dedicated memory modules in an IC in the past may have meant having to have multiples of such memory modules all powered at the same time due to a lack of granularity or selectivity in operation of such multiple memory modules. With the above general understanding borne in mind, various embodiments for memory modules of a memory system are generally described below.

These memory modules include registers and multiplexers, in addition to memory arrays, which are all provided as a configurable (or programmable) hard macro. Such hard macro is configurable with use of configuration memory cells. By providing a hard macro for a memory module, routing complexity may be reduced while performance may be increased. Along those lines, routing in programmable resource fabric may be avoided for forming stacks of such memory modules. Additionally, a plurality of modes of operation may be added with addition of a few dedicated circuit resources.

Because one or more of the above-described embodiments are exemplified using a particular type of IC, a detailed description of such an IC is provided below. However, any type of IC having dedicated memory modules may benefit from one or more of the embodiments described herein. Furthermore, even though the following description is in terms of dedicated random access memory blocks ("BRAMs"), which may have static random access memory ("SRAM") cells, other types of memory modules may be used having other types of memory cells.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figures 1, 3:
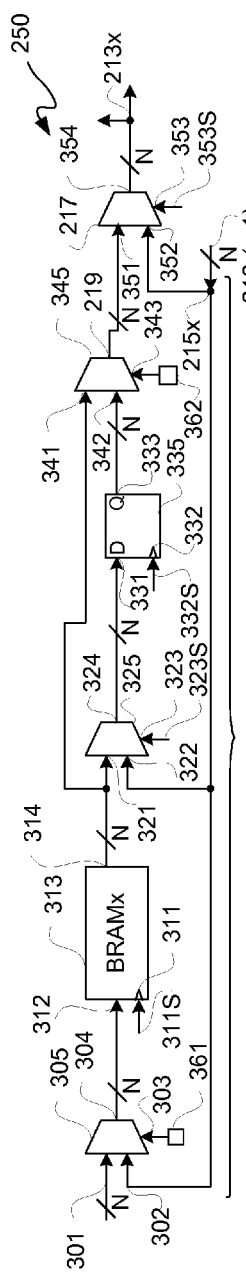

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

FIG. 2 is a block diagram depicting an exemplary memory system 200 of an IC chip. In this example, there are four BRAM modules 250 cascaded with respect to one another; however, in other examples there may be as few as two or more than four BRAM modules 250 cascaded with respect to one another. BRAM modules 250 may be provided as respective configurable hard macros, namely BRAM modules 250 may be provided as embedded or dedicated circuitry in an IC chip having configuration memory cells for setting some signal states. Thus, memory system 200 may be a part of a column of BRAMs 103 of an FPGA 100 of FIG. 1. By providing a column of such configurable hard macros, configurations allowing for parallel cascading of data within such a column may be provided without having to pass such data through slower programmable fabric resources.

Each BRAM module 250 has an upper memory block 201 and a lower memory block 202 separate from one another. In this example, as there are four BRAM modules 250-0 through 250-3, upper memory blocks 201 are labeled as memory blocks 201-0 through 201-3 corresponding to respective BRAM modules 250-0 through 250-3. Likewise, lower memory blocks 202 are labeled as memory blocks 202-0 through 202-3 corresponding to respective BRAM modules 250-0 through 250-3.

BRAM modules 250, as well as associated memory blocks 201 and 202, are labeled -0 through -3 from a starting to an ending BRAM module or memory block in a column of cascaded BRAM modules or memory blocks. In this example, upper memory blocks 201 of BRAM modules 250 are cascade coupled to provide a memory column 203, and lower memory blocks 202 are cascade coupled to provide a memory column 204.

Each memory column may have a separate data and address buses. In this example, memory column 203 has a data bus 206 and an address bus 205. Address bus 205 is commonly coupled to each write address port A of memory blocks 201-0 through 201-3. In this example, data bus 206 is commonly coupled to each data-in port D of memory blocks 201-0 through 201-3. In another example, data bus 206 need not be commonly coupled, but rather each data port D of memory blocks 201-0 through 201-3 may receive a separate direct data input.

Likewise, in this example, memory column 204 has a data bus 208 and an address bus 207. Address bus 207 is commonly coupled to each write address port A of memory blocks 202-0 through 202-3. In this example, data bus 208 is commonly coupled to each data-in port D of memory blocks 202-0 through 202-3. Again, in another example, data bus 208 need not be commonly coupled, where each data-in port D of memory blocks 202-0 through 202-3 may receive a separate data input.

Memory column 203 has a read address bus 241, and memory column 204 has a read address bus 242. Address bus 241 may be commonly coupled to each read address port A of memory blocks 201-0 through 201-3. Address bus 242 may be commonly coupled to each read address port A of memory blocks 202-0 through 202-3.

Each memory block 201 and 202 of a BRAM module 250 may be coupled to a respective control multiplexer 217. For example, upper memory block 201-0 may be coupled to an instance of a control multiplexer 217, and lower memory block 202-0 may be coupled to another instance of a control multiplexer 217.

Each memory block 201 and 202 may have a respective block output port 219 for providing data to a block input port of a corresponding instance of a control multiplexer 217. Each control multiplexer 217 further may include a cascade input port 215 for receiving data from a lower order nearest neighbor BRAM 250. For example, a BRAM 250-1 has an upper memory block 201-1 which may provide data via a block output port 219 thereof to a control multiplexer 217 of BRAM 250-1, and such control multiplexer 217 may be coupled to a cascade input node 215 of BRAM 250-1, where such cascade input node 215 is a same node as an upper data-out 213U from a data-out port of a control multiplexer 217 coupled to memory block 201-0 of BRAM 250-0. Likewise, for example, BRAM 250-1 may have a lower memory block 202-1 which may provide data via a block output port 219 thereof to another instance of a control multiplexer 217 of BRAM 250-1, and such control multiplexer 217 may be coupled to a cascade input node 215 of BRAM 250-1, where such cascade input node 215 is a same node as a lower data-out 213L from a data-out port of a control multiplexer 217 couple to memory block 202-0 of BRAM 250-0. For purposes of clarity and not limitation, similar descriptions are not repeated for other lower-to-higher order nearest neighbor memory blocks within memory columns 203 and 204.

Even though single lines associated with conducting signals are illustratively depicted, in many instances such single lines represent parallel busing of bits, and thus may represent multiple conductive lines. For example, a BRAM module 250 may have a data output width of 72 bits; however, such data output width may be divided into two equal portions of 36 bits each. One of such portions, referred to herein as an "upper" portion, may be associated with memory column 203, and another of such portions, referred to herein as a "lower" portion, may be associated with memory column 204. The above-described bit widths are used for purposes of clarity by way of example and not limitation, as other bit widths may be used. Thus, for purposes of example, bits 0 through 35 are referred to as a lower portion, and bits 36 through 71 are referred to as an upper portion. Consistent with such nomenclature, outputs of control multiplexers 217 associated with upper memory blocks 201 are labeled as data-outs 213 with a "U" following such reference number, namely data-outs 213U. Likewise, outputs of control multiplexers 217 associate with lower memory blocks 202 are labeled as data-outs 213 with a "L" following such reference number, namely data-outs 213L.

An initial BRAM module 250-0 of a stack may optionally have a cascade input 211, as each BRAM module 250 may be formed replicating the same pattern over and over. However, there may not be any cascaded data to input to an initial BRAM module 250 of a stack, and thus such cascade input 211 may for example be coupled to a ground or a supply voltage. Likewise, an end BRAM module 250-$x$ of the stacked may optionally have a cascade output off of data-out 213, as each BRAM module 250 may be formed by replicating the same pattern over and over. However, there may not be any cascaded data to output to another BRAM module 250 of such a stack, and thus such cascade output off of data-out 213 may, for example, not be coupled to another BRAM module 250 of such a stack even though there may be a cascade output node/trace therefor.

Figure 4:
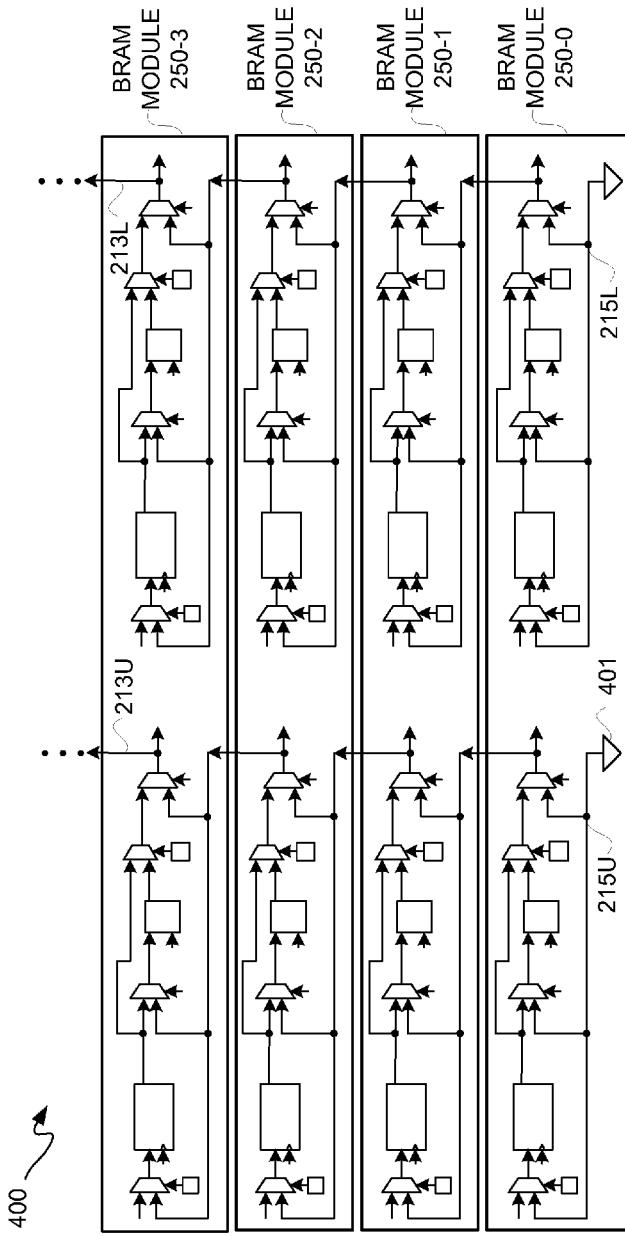
FIG. 4 is a block/circuit diagram depicting an exemplary stack of BRAM modules.

FIG. 3-1 is a block/circuit diagram depicting an exemplary upper or lower portion of a BRAM module 250. FIG. 3-2 is a block diagram depicting an exemplary cascade control block 370. FIG. 4 is a block/circuit diagram depicting an exemplary stack 400 of BRAM modules 250. With simultaneous reference to FIGS. 2 through 4, BRAM module 250 and stack 400 are further described.

In this example, an upper or lower portion of a BRAM module 250 includes a BRAM block 313, a register 335, and multiplexers 305, 325, 345, and 217. Thus each BRAM module 250 with upper and lower portions includes a plurality of BRAM blocks 313, registers 335, and sets of two-input multiplexers 305, 325, 345, and 217. In another example, multiplexer 217 may be a three-input multiplexer, in which example multiplexer 345 may be omitted. However, for purposes of clarity by way of example and not limitation, it shall be assumed that two-input multiplexers 305, 325, 345, and 217 are used.

Multiplexers 305 may be referred to as data-in multiplexers, where each such multiplexer 305 has a plurality of ports which may be referred to as a data-in input port 301, a cascade input port 302, a cascade/data-in select port 303, and a write data output port 304. A cascade/data-in select port 303 may be coupled to a configuration memory cell 361. Configuration memory cell 361 may be programmed to cause a data-in multiplexer 305 to select between input data on data-in input port 301 or cascade input data 213-($x$−1), where "x" refers to a BRAM module level, on cascade input port 302 for output of such selected data via write data output port 304. Thus, configuration memory cells 361 may be used to control output of data-in multiplexers 305.

Each BRAM block 313 may have a write data input port 312, a clock port 311, and a read data output port 314. Using a clock signal 311S provided to clock port 311, a BRAM block 313 may be operated as a synchronous memory. A BRAM block 313 may have additional ports, such as a write address port, a write enable port, a read enable port, and a read address port, among other ports which are generally not shown for purposes of clarity and not limitation. Along those lines, a BRAM block 313 may be a known BRAM of an FPGA. For example, a known BRAM may have four 9K bit memory arrays, where each such memory array may selectively output from 1 to 18 bits, and where such outputs may be concatenated to provide a 72 bit wide bus. For purposes of clarity by way of example not limitation, it shall be assumed that a 36 bit wide output is provided from a BRAM block 313, where such BRAM block 313 is associated with two of such memory arrays; however, in other examples other configurations of BRAM block 313 may be used, including without limitation other memory array sizes and/or bit-width sizes.

Write data input port 312 may be coupled to receive write data from write data output port 304. Data read from BRAM block 313 may be output from read data output port 314 as read data.

Multiplexers 325 may be referred to as pipeline multiplexers, where each such multiplexer 325 has a plurality of ports which may be referred to as a read data input port 321, a cascade input port 322, a pipeline select port 323, and a register data output port 324. A read data input port 321 may be coupled to receive read data output from read data output port 314. A pipeline select port 323 may be coupled to receive a "selx" signal 323S output from cascade control block 370, where "sel" refers to select and where "x" again refers to a BRAM module level, which in this example are integers from 0 to 3. Along those lines, BRAM block 313 is labeled as BRAMx. Responsive to "selx" signal 323S, pipeline multiplexers 325 may output read data, which may be referred to as register data, or may output cascade input data 213-($x$−1) via register data output port 324.

Each register 335 may have a register data input port 331, a registered data output port 333, and a clock port 332. Clock port 332 may be coupled to receive a register clock signal 332S. Register clock signal 332S and clock signal 311S may be either different or the same clock signal. Register data input port 331 may be coupled to register data output port 324 to receive register data therefrom. Register data stored in a register 335 may be clocked out responsive to register clock signal 332S via registered data output port 333.

Multiplexers 345 may be referred to as register/latch mode or data-out multiplexers, where each of such multiplexers 345 has a plurality of ports which may be referred to as a read data input port 341, a registered data input port 342, a registered/ unregistered select port 343, and a block output port 219. Read data input port 341 may be coupled to read data output port 314 to receive read data from a BRAM block 313. Registered data input port 342 may be coupled to registered data output port 333 to receive registered data clocked out of register 335.

Registered/unregistered select port 343 may be coupled to a configuration memory cell 362. Configuration memory cell 362 may be programmed to cause a data-out multiplexer 345 to select between read data on read data input port 341 or registered data on register data input port 342 for output of such selected data via block output port 219. Thus, configuration memory cells 362 may be used to control output of data-out multiplexers 345.

In this example, an upper or lower memory block 201 includes a BRAM block 313, a register 335, and multiplexers 305, 325, and 345. Thus output from a data-out multiplexer 345 may be referred to as block data output. Because a BRAM module 250 may have an output bus divided into an upper portion and a lower portion of an output bus, a block output port 219 of an upper memory block 201U may be for an upper portion of such an output bus of such a BRAM module 250, and a block output port 219 of a lower memory block 201L may be for an lower portion of such an output bus of such a BRAM module 250.

Multiplexers 217, referred to as control multiplexers, where each of such multiplexers 217 has a plurality of ports which may be referred to as a cascade input port 352, a block input port 351, a control select port 353, and a data-out port 354. Block input port 351 may be coupled to receive block data output from block output port 219. Cascade input port 352 may be coupled to receive cascade input data 213-(x−1). Control select port 353 may be coupled to receive a control select signal, namely a "cntlx" signal 353S where "cntl" refers to control and where "x" again refers to a BRAM module level. Control multiplexer 217, responsive to "cntlx" signal 353S, may select between block data output on block input port 351 or cascade input data 213-(x−1) on cascade input port 352 for output of such selected data via data-out port 354. Again, N width buses in this example are assumed to be 36 bits, and thus for example data-out port 354 would be a 36-bit wide bus.

Along those lines, cascade input ports 302, 332, and 352 may be commonly coupled to cascade input node 215x of a BRAM module level to receive cascade input data 213-(x−1) from a nearest neighbor lower BRAM module level. Data-out 213, which may be for an upper or lower portion of a bus of a BRAM module 250, may be cascade input data 213-(x−1) from a nearest neighbor lower BRAM module level or block data output from a memory block 201x of a current BRAM module level. A lowest level of a stack 400 of BRAM modules 250, such as BRAM module 250-0, may have an upper cascade input node 215U and a lower cascade input node 215L coupled to a static voltage, such as a ground 401 for example.

Cascade input ports 302, 332, and 352 of an upper memory block 201U of a BRAM module 250 may be coupled to an upper cascade input node 215U, and cascade input ports 302, 332, and 352 of a lower memory block 201L of such a BRAM module 250 may be coupled to a lower cascade input node 215L. A highest level of a stack 400 of BRAM modules 250, such as BRAM module 250-3, may have an upper data-out 213U and a lower data-out 213L which are not used for a cascade input to a subsequent BRAM module level of such a stack 400, as there is no subsequent BRAM module level for such a stack 400. A cascade input node 215 of a current or higher BRAM module level may be a same node as a data-out port 354 of a nearest neighbor lower BRAM module level. Such inter-BRAM module level coupling, as previously described, may be for multiple inter-BRAM module level couplings of a stack 400.

Even though four levels of BRAM modules 250 are illustratively depicted, as few as one BRAM module 250 may be used at a time. Furthermore, even though four levels of BRAM modules 250 are illustratively depicted for a stack 400, a stack 400 may have two or more levels of BRAM modules 250, and thus fewer or more than four levels of BRAM modules 250 may be used.

A block output port 219 of an upper memory block 201 may be for a first portion of an output bus of a BRAM module 250, and a block output port 219 of a lower memory block 202 may be for a second portion of an output bus of such BRAM module 250. Such configuration may be repeated for multiple BRAM modules 250 to provide stacks 400 on an IC, such as FPGA 100 of FIG. 1 for example. Thus, a memory column 203 or 204 may be used to provide a stack 400 of upper and lower portions, respectively, of BRAM modules 250, where data may be cascaded in parallel from low to high BRAM module levels within a configurable hard macro memory system 200, such as a serial chain of parallel streams of data for example for "vertical" busing of data within a memory system 200. However, parallel data-outs 213 from one or more data-out ports 354 associated with one or more upper memory blocks 201, for example, may be used to provide multiple parallel streams of data to programmable fabric resources in parallel, such as a plurality of data-outs 213U. Likewise, parallel data-outs 213 from one or more data-out ports 354 associated with one or more lower memory blocks 202, for example, may be used to provide multiple parallel streams of data to programmable fabric resources, such as a plurality of data-outs 213L. In such a configuration, a combination of an upper portion of an output bus of a BRAM module 250-3, for example, and an upper portion of an output bus of a BRAM module 250-2, for example, may provide an output bus to programmable fabric resources for "horizontal" busing of data out of a memory system 200.

Cascade control block 370 may be coupled to receive a plurality of control signals 371 and in response may be configured to provide selx signals 323SU and 323SL, as well as cntlx signals 353SU and 353SL. Signals 323SU and 353SU are provided to upper portions of BRAM modules 250, and signals 323SL and 353SL are provided to lower portions of BRAM modules 250. Examples of control signals may include without limitation: a To recapitulate, multiple BRAMs may be serially coupled to cascade data, which may be configurable from 1 to 36 bits for example, in a bottom-up direction to effectively make a larger memory block. In the past, such as serial concatenation of conventional BRAM was performed using programmable fabric resources, namely lookup tables ("LUTs"), which thus were slower, consumed more power, and/or consumed programmable fabric resources. Along those lines, a first-in, first-out buffer ("FIFO") configuration may be used, where an entire column of BRAM modules may be coupled as configurable hard macros to provide a deep FIFO that is not performance limited by having to use programmable fabric resources to couple stacks 400 to provide such FIFO. Because logic and routing are local to a hard macro memory system 200, such a FIFO may be operated at a significantly higher frequency than if programmable fabric resources were used to provide a concatenation of conventional BRAM to provide such a deep FIFO. Furthermore, half of a BRAM module may be used at a time. For example, data may be output from only uppermost portions of BRAM module buses. Likewise, data may be output from only lowermost portions of BRAM module buses. Additionally, both halves of a BRAM module bus may be used at the same time, but independently of one another. Even though the above description was for cascading data in a bottom-up direction, in other configurations data may be moved in a top-down direction and/or a bottom-up direction. Because all signal routing and control logic for serial cascading may be implemented inside a hard macro provided as a memory system, performance, including without limitation speed, may be enhanced. Additionally, as described below in additional detail, a low power mode may be used, or more particularly, data width may be more individually tailored to provide a balance between power and performance. Along those lines, it should be appreciated that a portion of a BRAM memory module may be used at a time. Even though data may be individually provided from connections to programmable fabric resources, common inputs across cascaded BRAM modules may be connected together using programmable interconnects of such programmable fabric resources. Furthermore, such cascading may be used with error correction coding.

BRAM modules 250, singularly or in combination, may be configurable for any of a plurality of modes. Generally, these modes may be categorized as a cascade mode and a memory mode, and variations of such modes are described below in additional detail.

Figures 2, 3, 5:
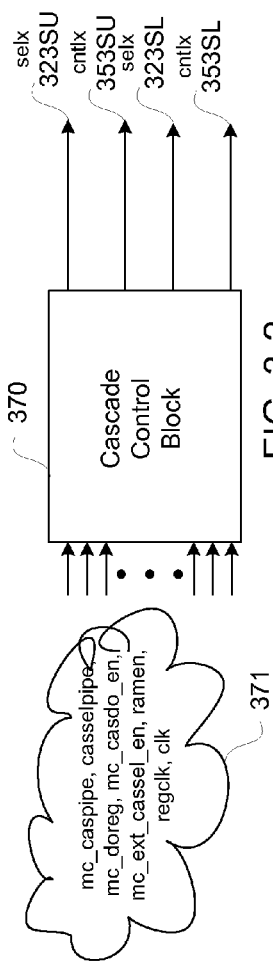
Figure 6:
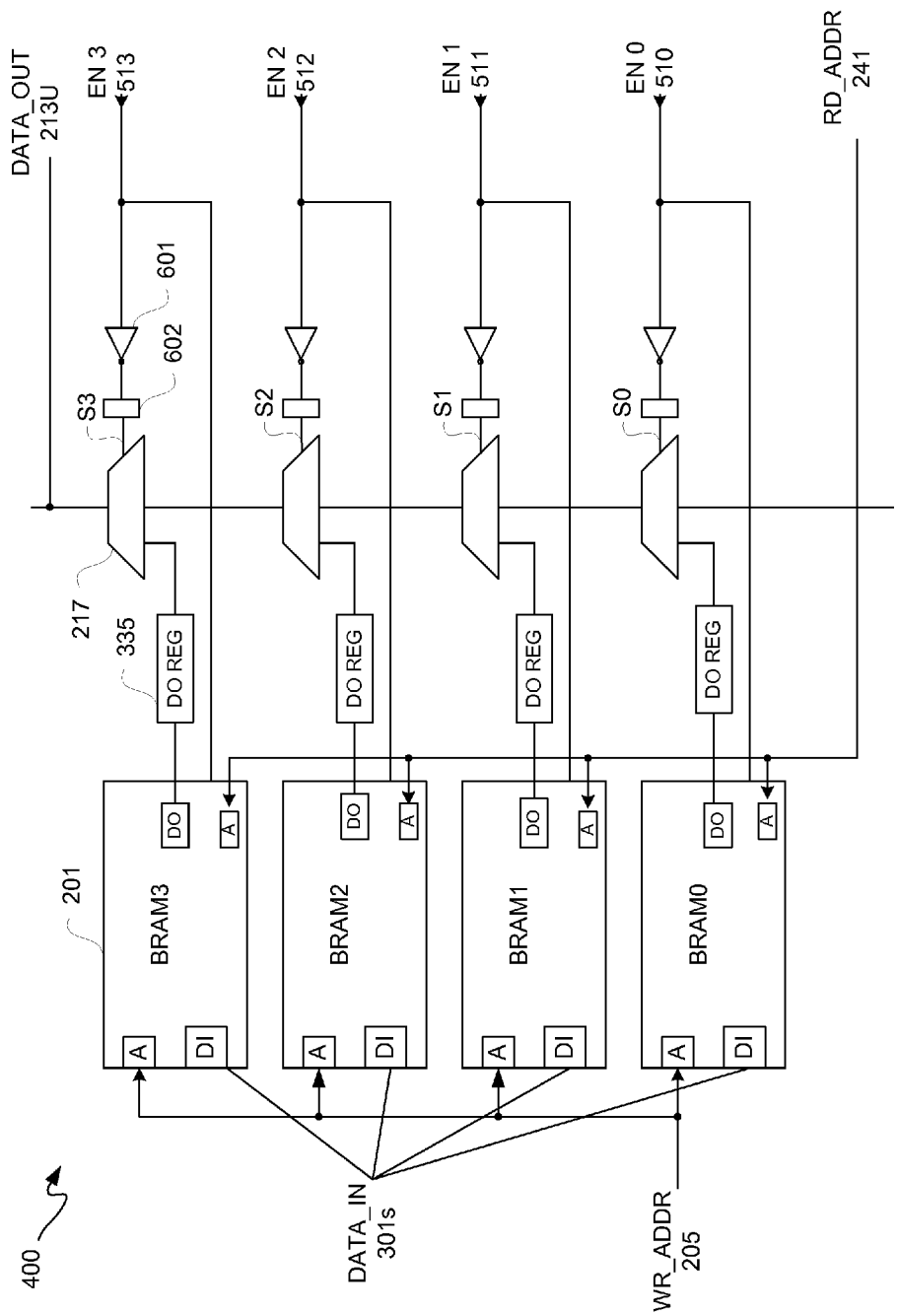
FIG. 6 is a block/circuit diagram depicting an exemplary stack in accordance with decoding table.

FIG. 5 is a table diagram depicting an exemplary decoding table 500. FIG. 6 is a block/circuit diagram depicting an exemplary stack 400 in accordance with decoding table 500. Even though stack 400 is for upper portions of BRAM modules 250, lower portions of BRAM modules 250 may likewise be used. BRAM modules 250 have been simplified in FIG. 6 for purposes of clarity and not limitation. Decoding table 500 is further described with simultaneous reference to FIGS. 1 through 6.

Decoding table 500 is for decoding enable signals 510 through 513 ("EN0 through EN3") and select signals 353S0 through 353S3 ("S0 through S3") for four cascaded BRAM modules 250. Column 501 indicates in which BRAM block 313 data resides for a current operation. Columns for enable signals 510 through 513 indicate status of BRAM blocks 313 of column 501. Likewise, columns 353S0 through 353S3 indicate status of select signals of corresponding BRAM blocks 313 of column 501. A logic 1 in decoding table 500 indicates that a signal associated therewith is asserted, and a logic 0 in decoding table 500 indicates that a signal associated therewith is not asserted. A "X" in decoding table 500 indicates that it does not matter ("don't care") whether a signal associated therewith is a logic 0 or 1.

As BRAM blocks 313 may be known BRAM of an FPGA, such BRAM blocks may have four 9 kilo-bit ("K") memory arrays of SRAM cells. To select which of these arrays are used, an additional two address bits may be provided for 2-to-4 decoding. Such BRAM has other known signals, in addition to enable signals.

Generally, decoding table 500 is for a "one hot" configuration of BRAM modules 250. In this mode, output of a lower-level BRAM module is multiplexed with output of an upper-level BRAM module, which serially may get multiplexed with a next higher-level BRAM output. This type of serial cascading may use less routing lines and may be scaled from two BRAM modules 250 to as many BRAM modules 250 in a memory column 203 or 204.

As described herein, BRAM modules 250 provide multiple ways to multiplex data out from different BRAM modules. For serial cascading, one or more of configuration memory cells, such as may be coupled to cascade control block 370, multiplexers 217 to choose between data read from a corresponding BRAM block 313 or data obtained from a lower-level BRAM module cascade output. Along those lines, BRAM modules 250 may be configured for a continuous flow of data mode.

A default option may be to allow a BRAM block enable signal 510 through 513 respectively provided to memory blocks 201 to likewise be provided to inverters 601 of cascade control block 370 to be used to perform data output multiplexing, as illustratively depicted with reference to decoding table 500. Configuration memory cells 602 may be respectively programmed responsive to output from corresponding inverters 601 to respectively provide select signals S0 through S3. Along those lines, enable signals 510 through 513 may be thought of as corresponding cascade enable signals. Select signals S0 through S3 may be provided to corresponding control or cascade multiplexers 217.

When multiple BRAM modules 250 are cascaded together, only one BRAM block enable signal 510 through 513 is active at a time with respect to decoding table 500, namely a "one hot" scheme. The active or asserted BRAM block enable signal may be for a BRAM block 313 from which data is to be read, and accordingly a BRAM block enable signal of BRAM block enable signals 510 through 513 for such BRAM block 313 may be set to a logic 1. All other BRAM block enable signals 510 through 513 may be set to a logic 0 state at this time. Cascade control block 370 may use such decoding to set internal memory system 200 to control cascade multiplexing. For example, if a BRAM block enable signal 510 through 513 is set to a logic 0, output data may come from a cascaded input and not from a corresponding BRAM block 313. Along those lines, a user may provide a decoded address for each cascaded BRAM block 313 associated with each asserted BRAM block enable signal. Decoding table 500 indicates that enable signals 510 through 513 may be successively asserted for different BRAM blocks 313 to generate internal multiplexer control signaling to control output from control multiplexers 217 of successive BRAM modules 250.

Using a one hot scheme for selectively activating BRAM blocks may be an efficient use of power, as only BRAM blocks 313 having useful data may be accessed one at a time. In a register mode, a select signal used for cascade multiplexing may be delayed by one clock cycle, namely a one clock cycle latency. An internal cascade A/B signal and/or an external cascade select A/B signal provided to cascade control block 370 may be asserted to control cascade multiplexing. During a one hot cascade mode, if a BRAM block 313 has a cascade data out enable configuration memory cell set to a logic 1, a BRAM cascade signal associated therewith may be activated for a next BRAM module level to continue a cascade chain. If, however, such a cascade data out enable A/B configuration memory cell is set to a logic 0, such cascading may be disabled from switching in such one hot cascade mode to conserve power. For example, an uppermost BRAM block 313 in a cascade chain may be disabled using a cascade data out enable A/B signal set to a logic 0 to save switching power.

Figure 7:
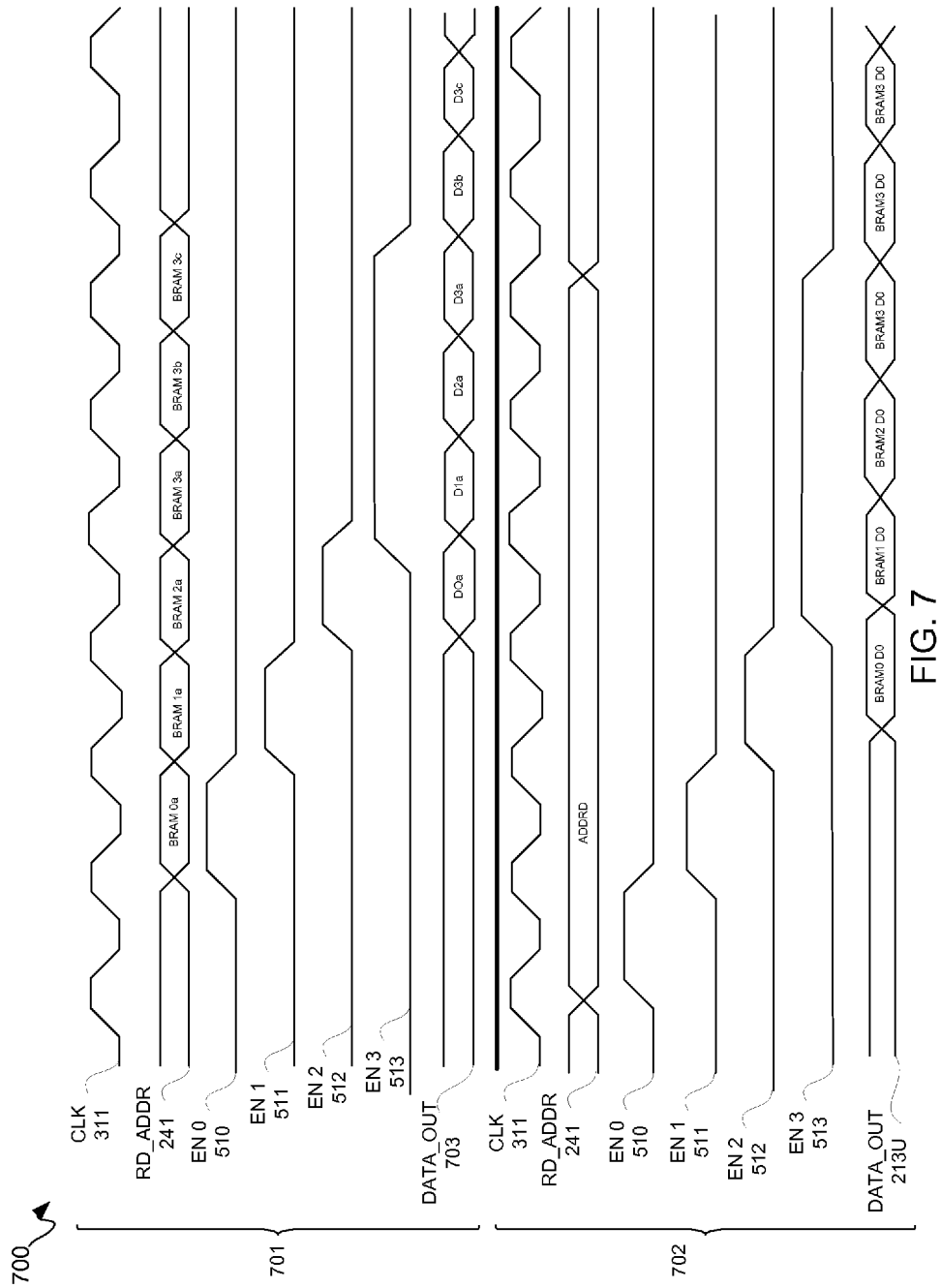
FIG. 7 is a signal-timing diagram depicting an exemplary four-deep one hot cascade mode ("cascade mode").

FIG. 7 is a signal-timing diagram depicting an exemplary four-deep one hot cascade mode ("cascade mode") 700. Cascade mode 700 is for low-frequency operation and is for a two-stage burst mode. Even though a two-stage burst mode is illustratively depicted, longer burst modes may be used. A first burst stage 701 illustratively depicts exemplary states of a clock signal 311, read address signal 241, enable signals 510 through 513, and a combined data out signal 703 for outputting data from BRAM blocks 313 for data output registers 335. A second burst stage 702 illustratively depicts exemplary states of a clock signal 311, read address signal 241, enable signals 510 through 513, and a data-out 213U.

Figure 8:
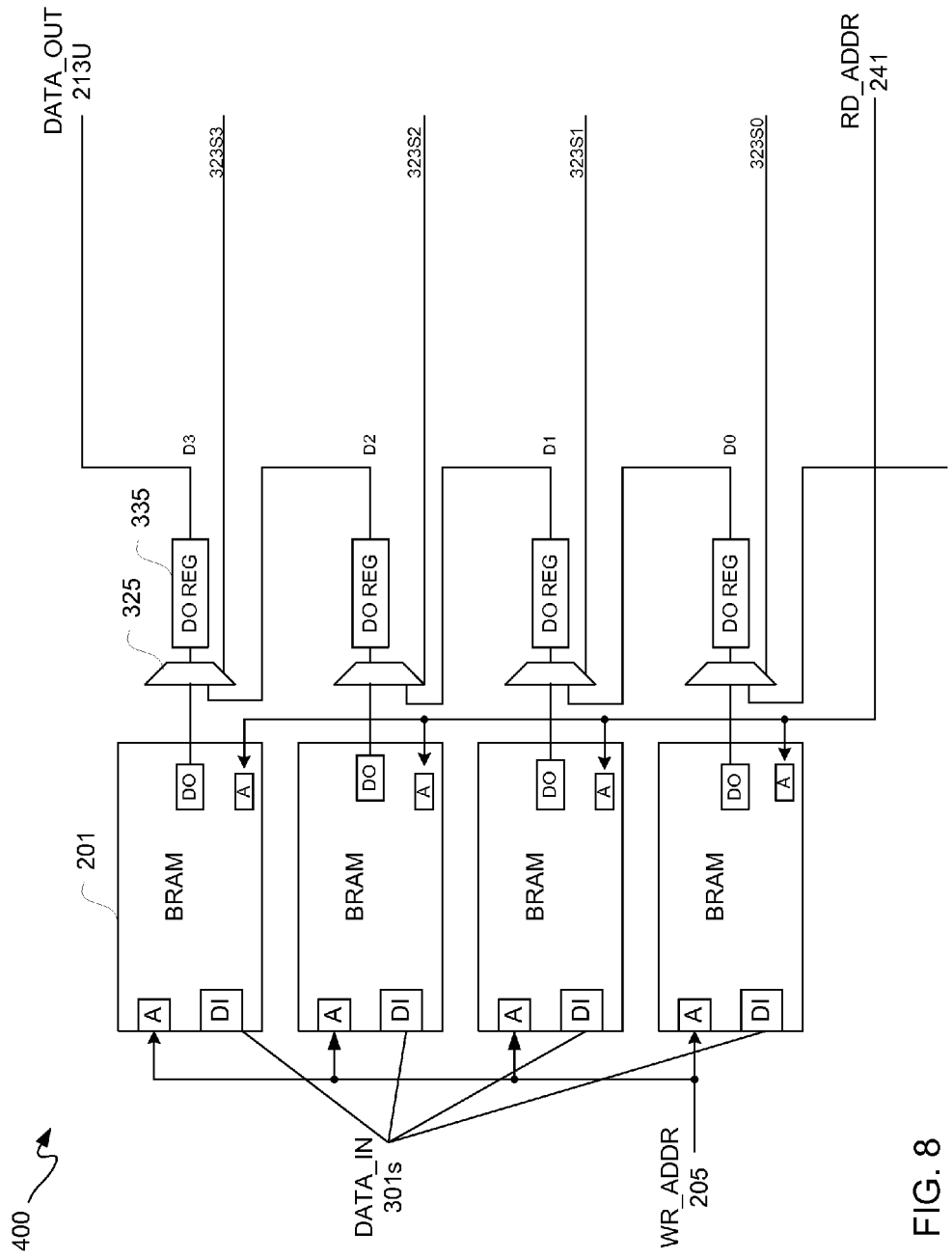
FIG. 8 is a block/circuit diagram depicting an exemplary stack configured for a data out cascade pipeline mode ("pipeline cascade mode").

FIG. 8 is a block/circuit diagram depicting an exemplary stack 400 configured for a data out cascade in pipeline mode ("pipeline cascade mode"). Even though stack 400 is for upper portions of BRAM modules 250, lower portions of BRAM modules 250 may likewise be used. BRAM modules 250 have been simplified in FIG. 8 for purposes of clarity and not limitation. A pipeline cascade mode is further described with simultaneous reference to FIGS. 1 through 8.

A pipelined cascade mode allows a user to employ a cascade mode with a high frequency of operation. In this configuration, output registers 335 are used as additional pipeline stages to obtain a higher frequency of operation in a cascade mode. A cascade/pipeline A/B configuration memory cell 362 and a data out register A/B configuration memory cell of register 335 may each be set to a logic 1. Select signal 323S may be set to multiplex data from a previous or lower-level nearest neighbor BRAM module 250 or from a current or current-level BRAM module 250 to cause output data to be stored in corresponding registers 335. A pipelined cascade mode may be used, or more generally when a pipelined mode is used, a final multiplexer, namely control multiplexer 217 respectively of BRAM modules 250, may be set to select data from a current-level BRAM module 250 for output. During a pipelined cascade mode, cascading data output propagates through registers 335.

Figure 9:
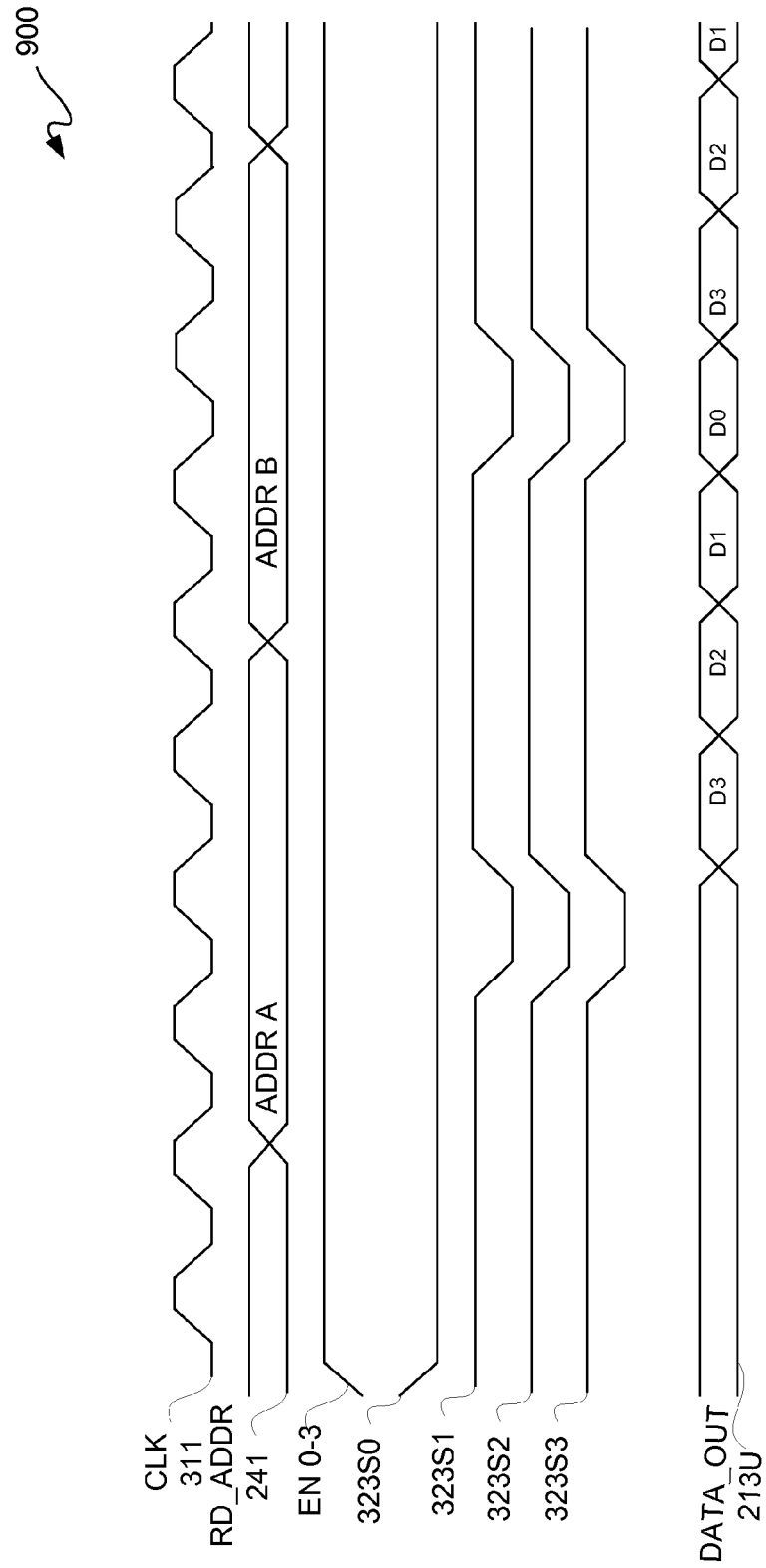
FIG. 9 is a signal-timing diagram depicting an exemplary four-deep pipeline cascade mode ("cascade mode") for the exemplary stack of FIG. 8.

FIG. 9 is a signal-timing diagram depicting an exemplary four-deep pipeline cascade mode ("cascade mode") 900 for exemplary stack 400 of FIG. 8. Cascade mode 900 is for high frequency operation and is for a three-stage burst mode with a burst length of 4 using four BRAM modules 250. Even though a burst length of four is illustratively depicted, any burst length may be used. Cascade mode 900 illustratively depicts exemplary states of a clock signal 311, read address signal 241, a combination of enable signals 510 through 513 ("EN 0-3"), cascade enable signals 323 S0 through S3, and a data-out 213U.

Figure 10:
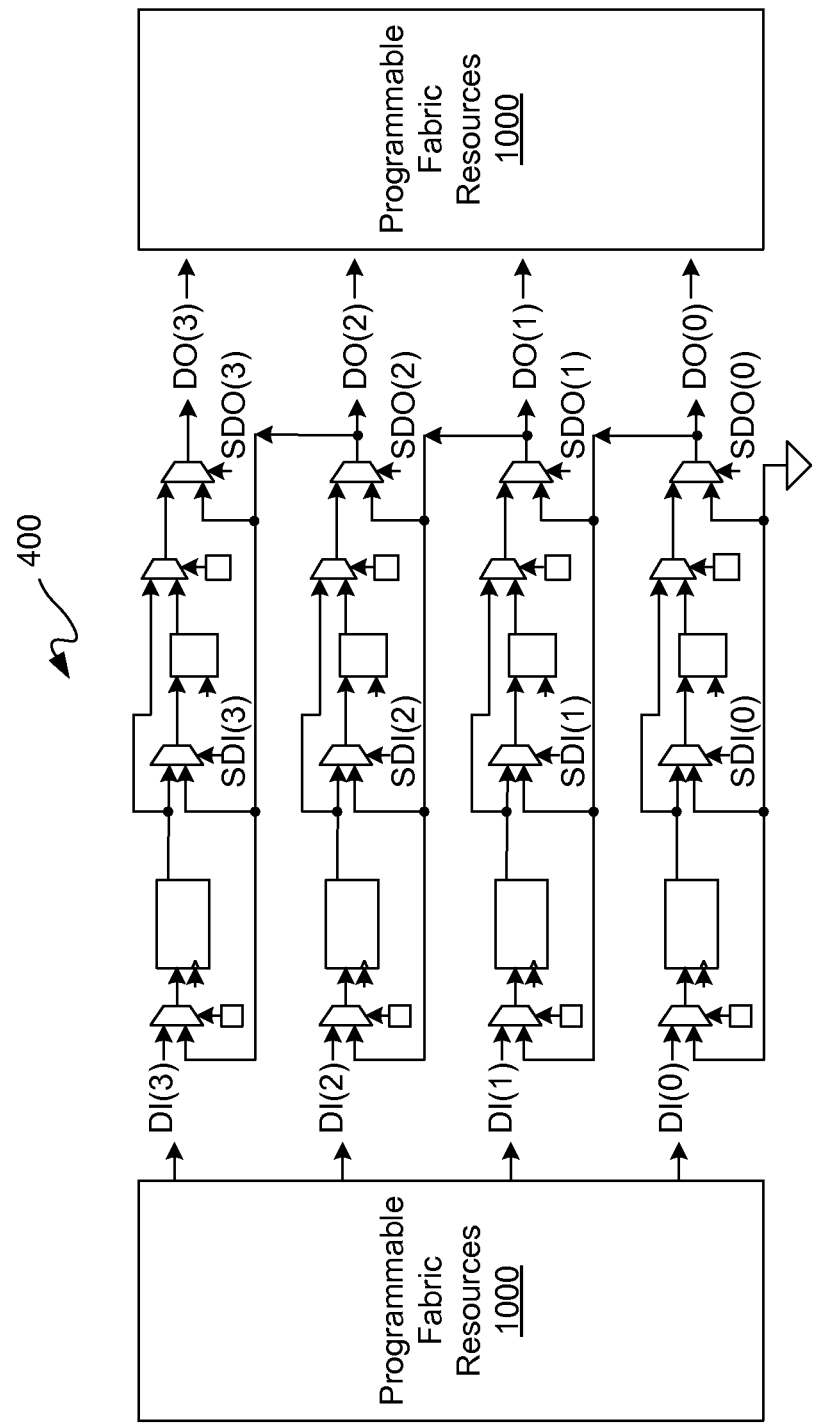
FIG. 10 is a block/circuit diagram depicting an exemplary upper portion or lower portion stack coupled to programmable fabric resources on an input side and an output side of such stack.

FIG. 10 is a block/circuit diagram depicting an exemplary embodiment of an upper portion or lower portion stack 400 coupled to programmable fabric resources 1000 on an input side and an output side of such stack 400. FIG. 10 is further described with simultaneous reference to FIGS. 2 through 9.

For purposes of clarity by way of example not limitation, stack 400 includes four BRAM modules 250. BRAM modules 250 of stack 400 have been simplified for purposes of clarity and not limitation. In particular, data-in input signals to ports 301 have been labeled as data input signals DI(0) through DI(3) corresponding to their associated BRAM modules 250. Likewise, selx signals 323S have been labeled select data input signals SDI(0) through SDI(3) corresponding to their associated BRAM modules 250, and cntlx signal 353S have been labeled select data output signals SDO(0) through SDI(3) corresponding to their associated BRAM modules 250. Using this simplified configuration, various modes or configurations of stacks 400 are further described.

Generally, an SDO(x) signal is a dynamic one-bit select signal to control output multiplexing for an output bus of a BRAM module 250, which in the above example is a 72-bit bus. Such an SDO(x) signal may be used for bus multiplexing to save power, wide bus RAM configurations, a low power wide BRAM use mode, or a static FIFO cascade. Generally, an SDI(x) signal is a dynamic one-bit select signal to control input source of an output register, either output cascade or RAM latch output. Such an SDI(x) signal may be used for multiple-stage deep RAM at a high frequency of operation in conjunction with output multiplexing, or vector/burst nonrandom access though memory at a high frequency with multiple levels of memory depth.

Figure 11:
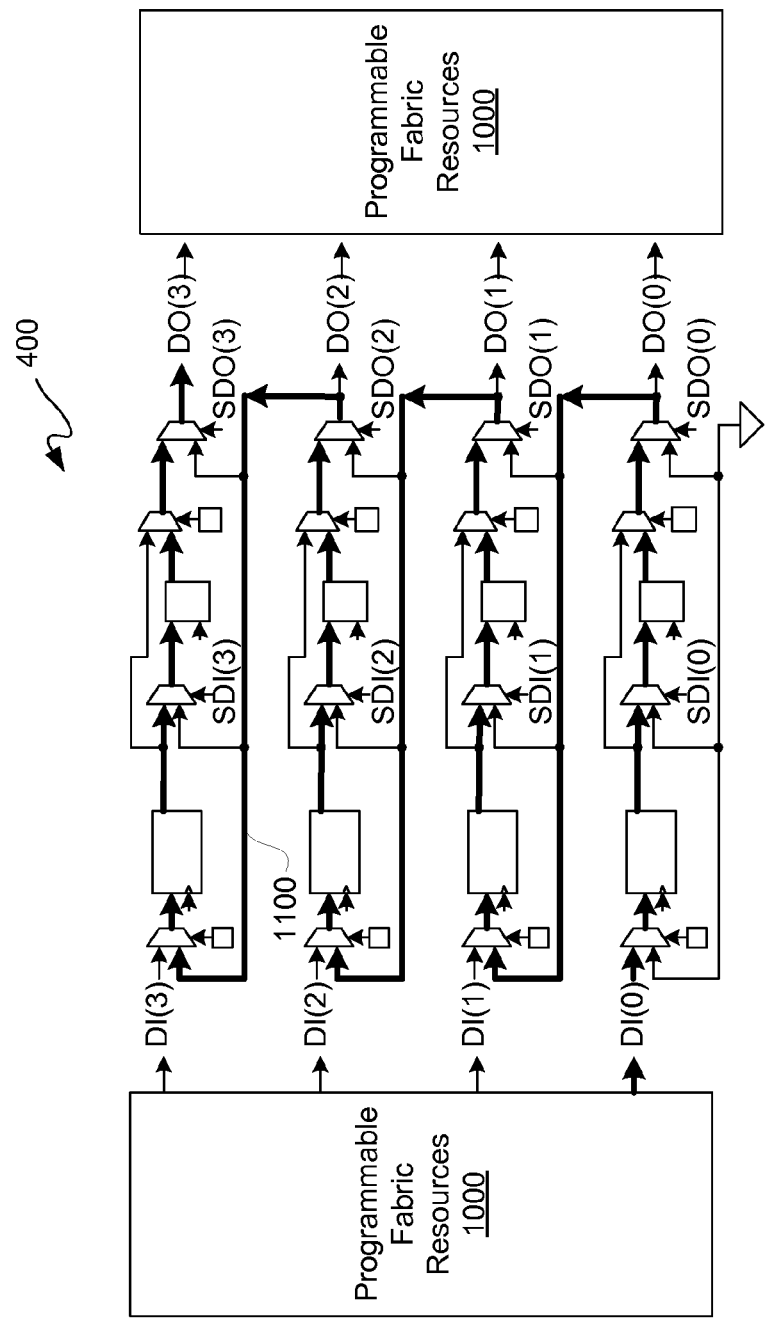
FIG. 11 is the block/circuit diagram of FIG. 10 depicting an exemplary systolic mode or first-in, first-out buffer ("FIFO") mode having a data path as generally indicated by thick black lines.

FIG. 11 is the block/circuit diagram of FIG. 10 depicting an exemplary systolic mode or FIFO mode having a data path 1100 as generally indicated by thick black lines. More particularly, with respect to a systolic mode, data may be input for a cascade for a systolic write, which may be thought of as a pipeline write. A data path 1100 through stack 400 indicates movement of data through four BRAM modules 250 for a systolic mode. Data path 1100 may start with DI(0) input from programmable fabric resources 1000.

A systolic mode allows a user to write data into a lower-level BRAM block 313 and then later read out data from such lower-level BRAM block 313 for writing into a nearest neighbor higher-level BRAM block 313. This progression may continue until such data has propagated through all cascaded BRAM modules 250. A user may randomly pull out data from any of such cascaded BRAM modules. In this configuration, only data may be cascaded from lower to upper levels and the stack 400 using dedicated routing inside a memory system 200 hard macro tile. Other input signals may be applied to such memory system hard macro tile from programmable interconnects of programmable fabric resources 1000. Data output cascaded from a lower-level BRAM module 250 to a nearest neighbor upper level BRAM module 250 may be controlled by a cascade data input select A/B signal, such as an SDI(x) signal, to allow read data from a lower-level BRAM module to be written into a BRAM block 313 of an upper-level BRAM module.

Data path 1100 is the same for a FIFO mode, which may be performed as a full speed cascade including without limitation error correcting code. A FIFO mode is described below in additional detail.

Figures 1, 12:
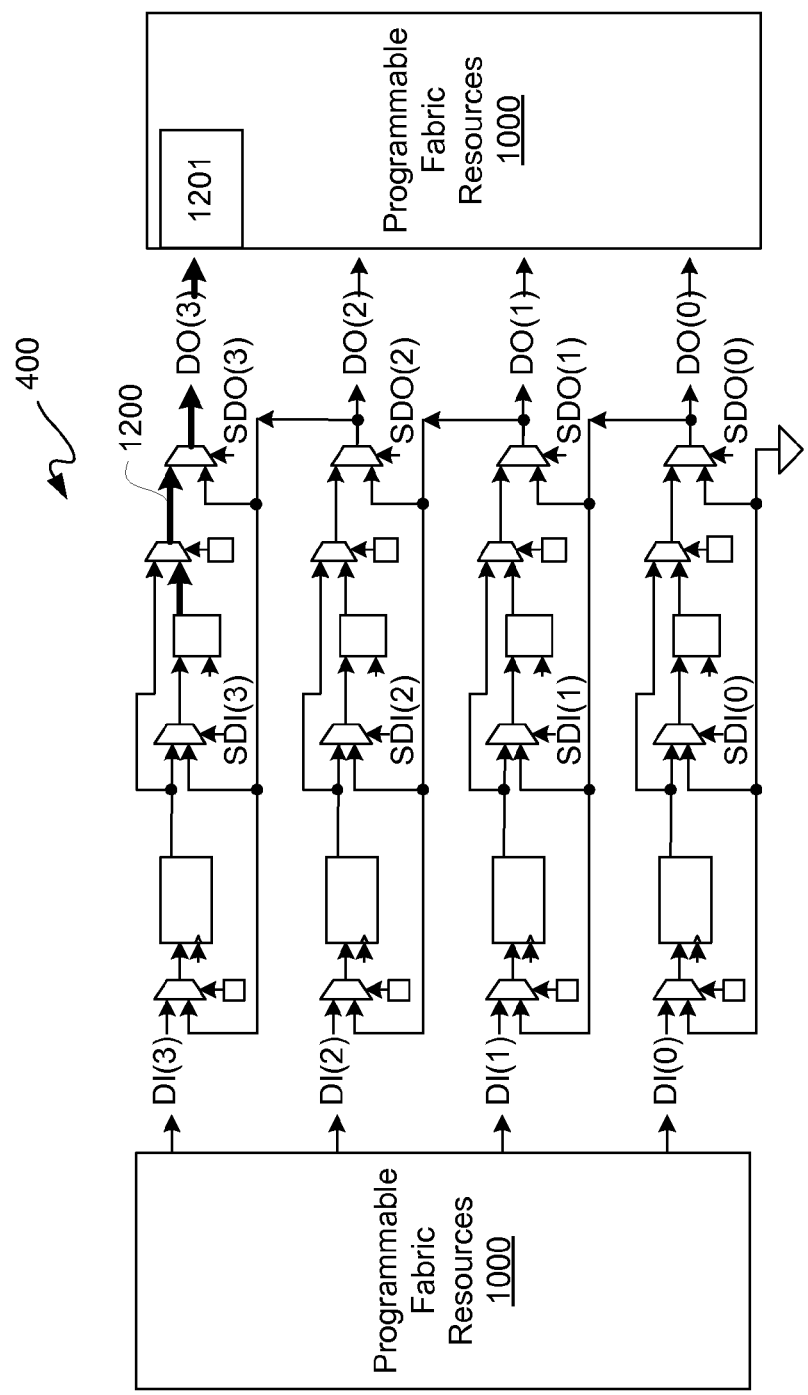
Figures 2, 12:
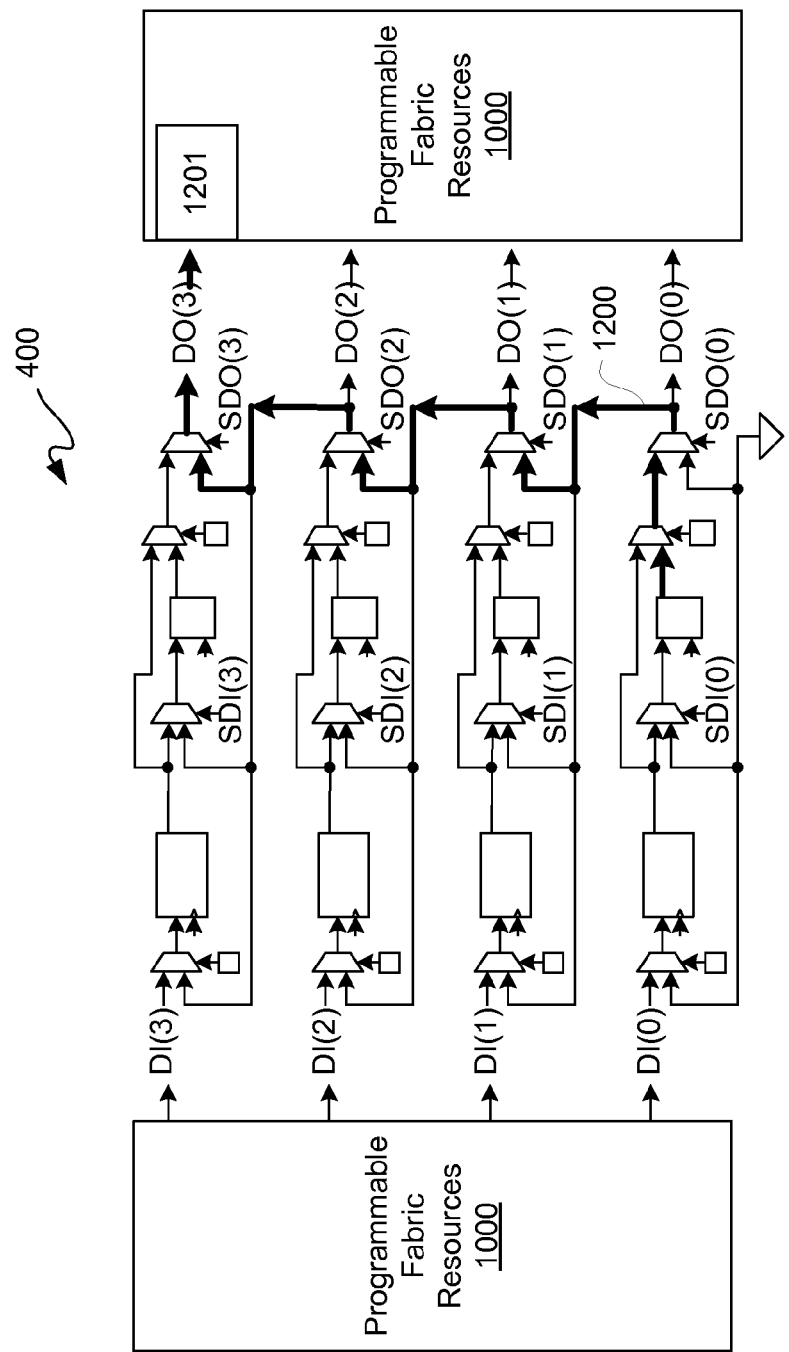

FIG. 12-1 is the block/circuit diagram of FIG. 10 depicting an exemplary low-power register mode having a data path 1200 as generally indicated by thick black lines. Data may be loaded into a register 335 of any of BRAM modules 250. In a register mode, only one BRAM module 250 register 335 is activated at a time, namely a one hot register cascade mode.

Even though data path 1200 for a register mode is illustratively depicted going from an upper most BRAM module, namely BRAM module 250-3, to a register 1201 in programmable fabric resources 1000, a register mode may be initiated from any register 335 in stack 400. In a register mode, after data is loaded into a register 335, such data may be repetitively clocked out of such register, which is faster than a below-described latch mode. In this example, data output from the stack is DO(3).

FIG. 12-2 is the same block/circuit diagram as FIG. 12-1, except data path 1200 is initiated at a register 335 of a lowermost BRAM module 250-0 of stack 400 and cascaded upward from such register 335. Accordingly, it should be understood that a register mode may be initiated from any one register 335 at a time of a stack 400, and such data may be cascaded out to an uppermost BRAM module 250 level for output from stack 400, which in this example such data is DO(0) though output as data DO(3). This cascading bypasses upper-level registers, as only upper level control multiplexers 217 are used.

Figures 1, 13:
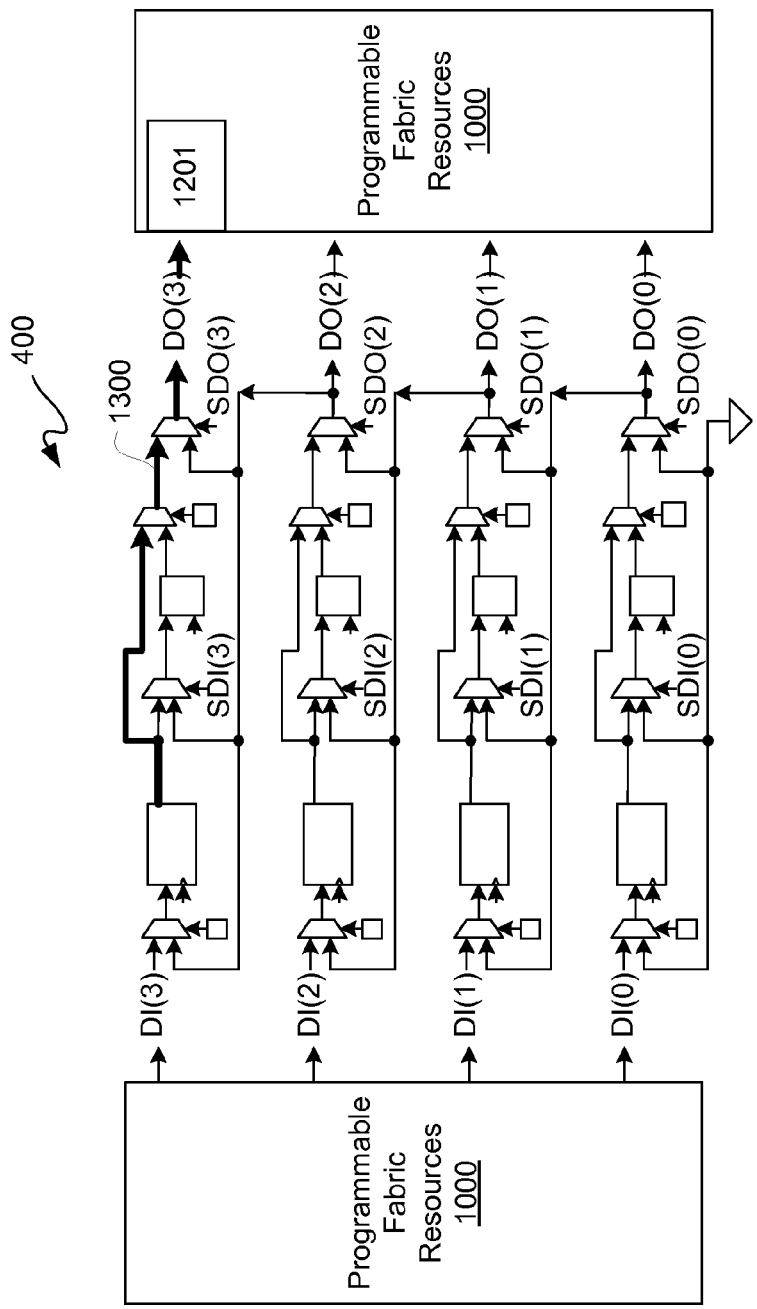
Figures 2, 13:
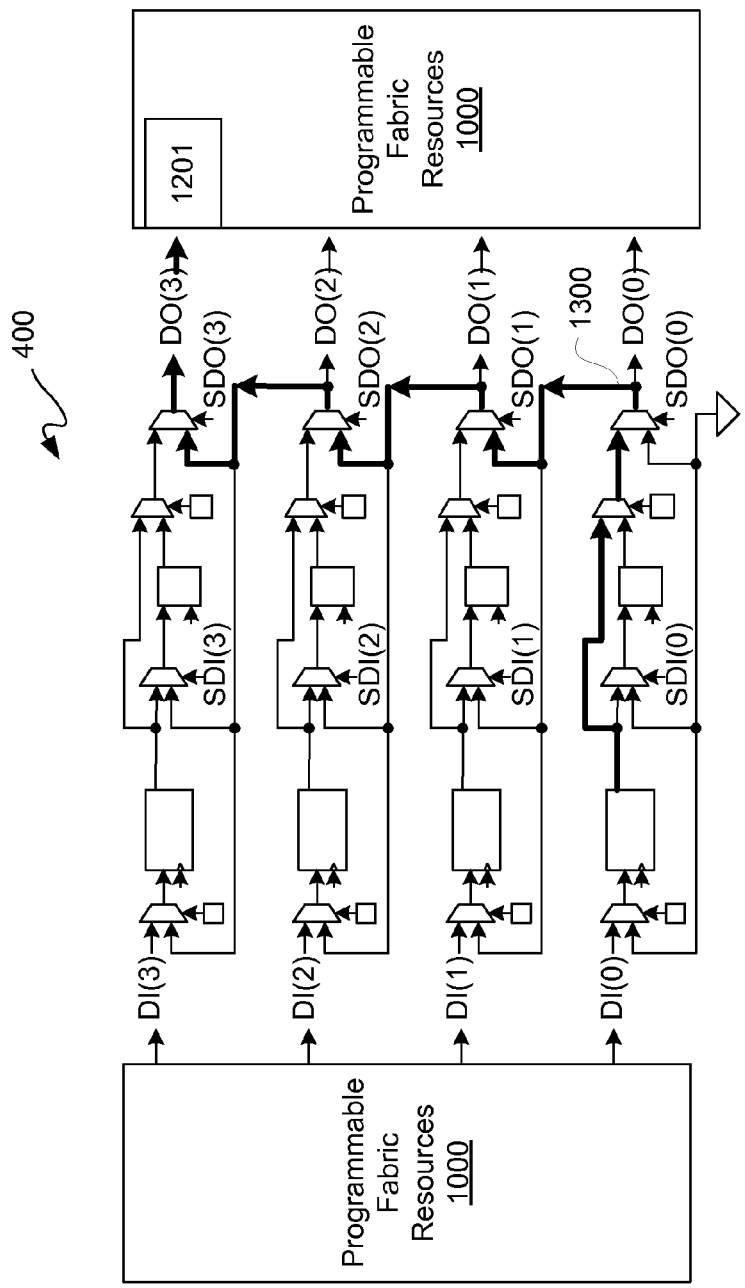

FIG. 13-1 is the block/circuit diagram of FIG. 10 depicting an exemplary latch mode having a data path 1300 as generally indicated with thick black lines. In this example, a BRAM block 313 reads out data along data path 1300 for output as DO(3) from an uppermost BRAM module 250-3 of a stack 400. For latch mode, data is not registered in register 335 of such BRAM module 250-3. Accordingly, a latch mode may be thought of as a low latency latch cascade mode, because registers 335 of stack 400 are not used, and because a latch mode may be initiated from any BRAM block 313 of a stack 400.

Along those lines, FIG. 13-2 is the same block/circuit diagram as FIG. 13-1, except data path 1300 is initiated at a BRAM block 313 of a lowermost BRAM module 250-0 of stack 400 and cascaded upward from such BRAM block 313. Accordingly, it should be understood that a latch mode may be initiated from any one BRAM block 313 at a time of a stack 400, and such data may be cascaded out to an uppermost BRAM module 250 level for output from stack 400, which in this example such data is DO(0) though output as data DO(3). This cascading bypasses upper-level registers and upper-level BRAM blocks, as only upper level control multiplexers 217 are used.

Figures 1, 14:
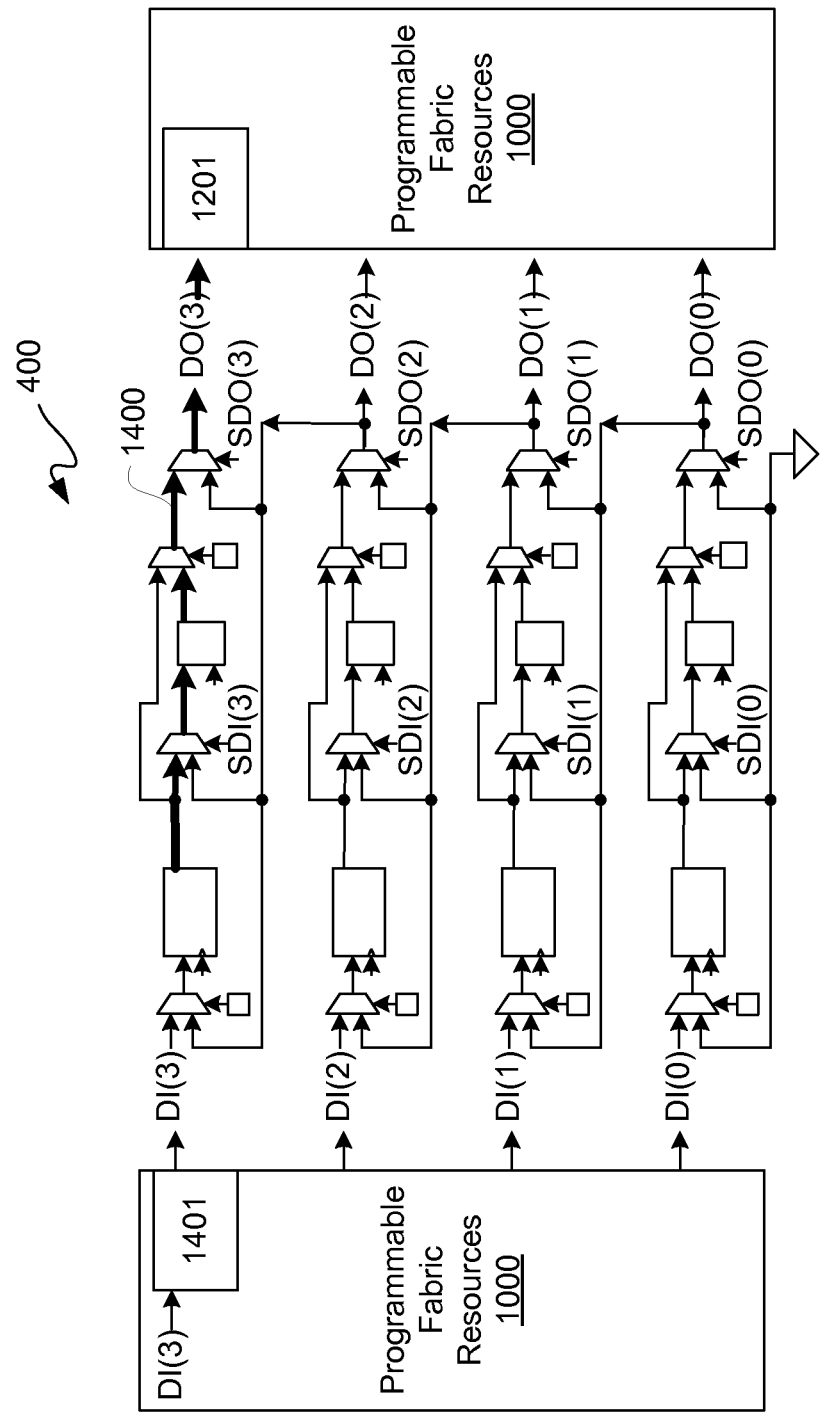
Figures 2, 14:
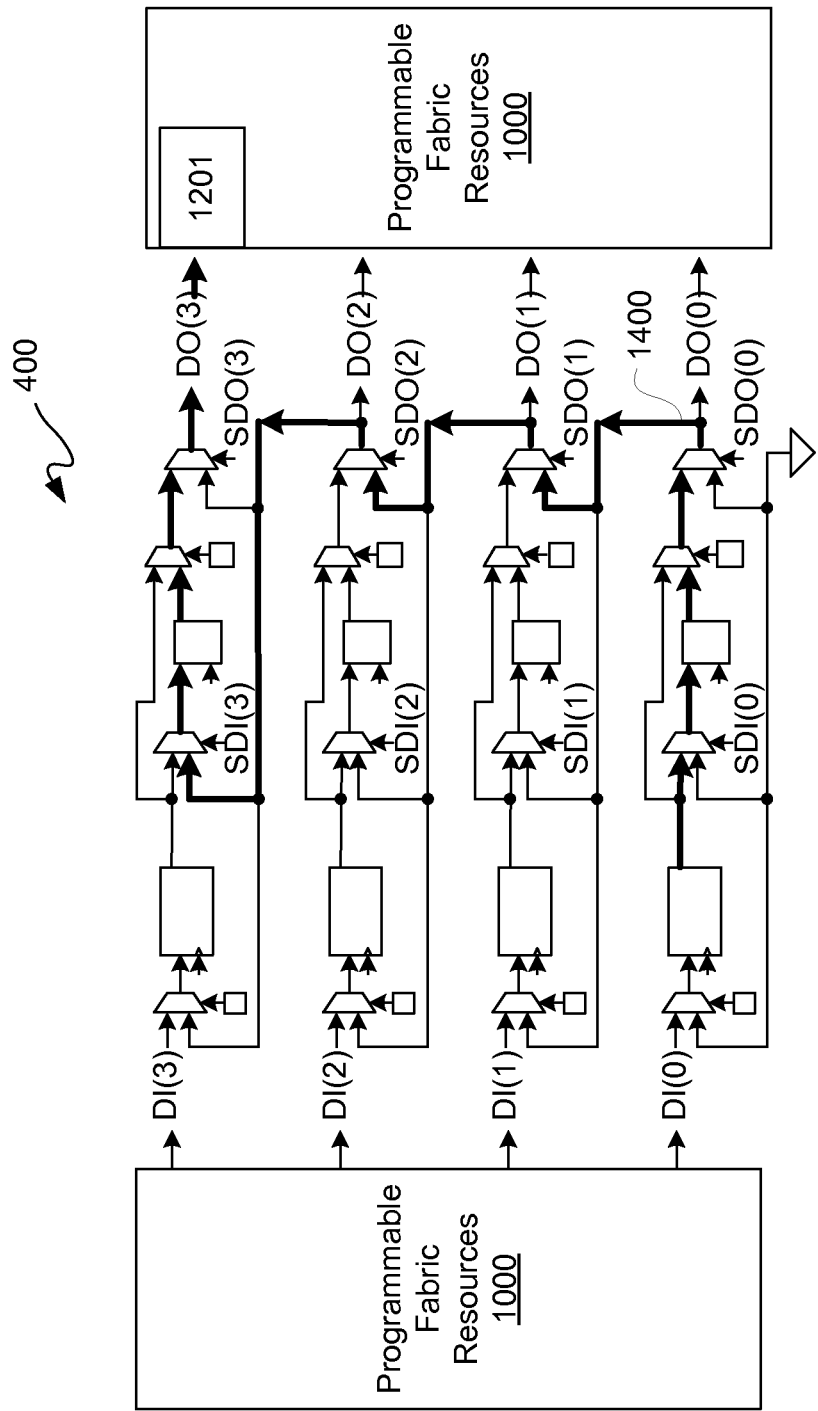

FIG. 14-1 is the block/circuit diagram of FIG. 10 depicting an exemplary multistage register mode having a data path 1400 as generally indicated with thick black lines. This register mode is similar to the above-described register mode, except this is a three-stage RAM register mode. Even though the example is for a three-stage RAM register mode, any number of two or more stages of RAM may be used for such register mode. In this register mode, both a BRAM block 313 and a register 335 of a BRAM module, such as BRAM module 250-3, are clocked. Along those lines, three stages of data may be clocked from BRAM block 313 to register 335 along data path 1400 for output as data DO(3), also along data path 1400, from stack 400. In other words, RAM of BRAM block 313 may be three-staged deep. Along those lines, data DI(3) may be clocked into a register 1401 of programmable fabric resources 1000 for input to such BRAM block 313, and data DO(3) may be clocked out of stack 400 for input to register 1201 of such programmable fabric resources 1000. In a three-stage pipeline, where one or more lower BRAM modules, such as BRAM module 250-0 for example, is/are using an uppermost BRAM output register, such as register 335 of BRAM module 250-3 for example, to improve maximum frequency of operation, a fabric pipeline stage, such as register 1401 for example, may be coupled to provide input to a BRAM 313 of such uppermost BRAM module for providing address signals, data signals, and enable signals, among other BRAM signals, as an alignment compensation to have an effective three-stage pipeline. Even though only a data signal DI(3) is illustratively depicted for purposes of clarity, such other signals may be present as described herein as provided from programmable fabric resources 1000.

Along those lines, FIG. 14-2 is the same block/circuit diagram as FIG. 14-1, except data path 1400 is initiated at a BRAM block 313 of a lowermost BRAM module 250-0 of stack 400 and cascaded upward from such BRAM block 313, and except there is no initial register 1401 in FIG. 14-2. Accordingly, it should be understood that a multistage register mode may be initiated from any one BRAM block 313 at a time of a stack 400, and such data may be cascaded out to an uppermost BRAM module 250 level for output from stack 400, in this example such data is DO(0) though output as data DO(3). This cascading bypasses interim upper-level registers and all upper-level BRAM blocks. However, in contrast to a latch mode as in FIG. 13-2 or a register mode as in FIG. 12-2, an uppermost level register 335 is not bypassed. Rather, data path 1400 uses register 335 of BRAM module 250-3 for outputting such data. Data DI(0) may be clocked into BRAM block 313, and data DO(0) may be clocked out of stack 400 for input to register 1201 of such programmable fabric resources 1000. Other signals may be provided to such lowermost BRAM block 313 from programmable fabric resources 1000, as previously described.

Figure 15:
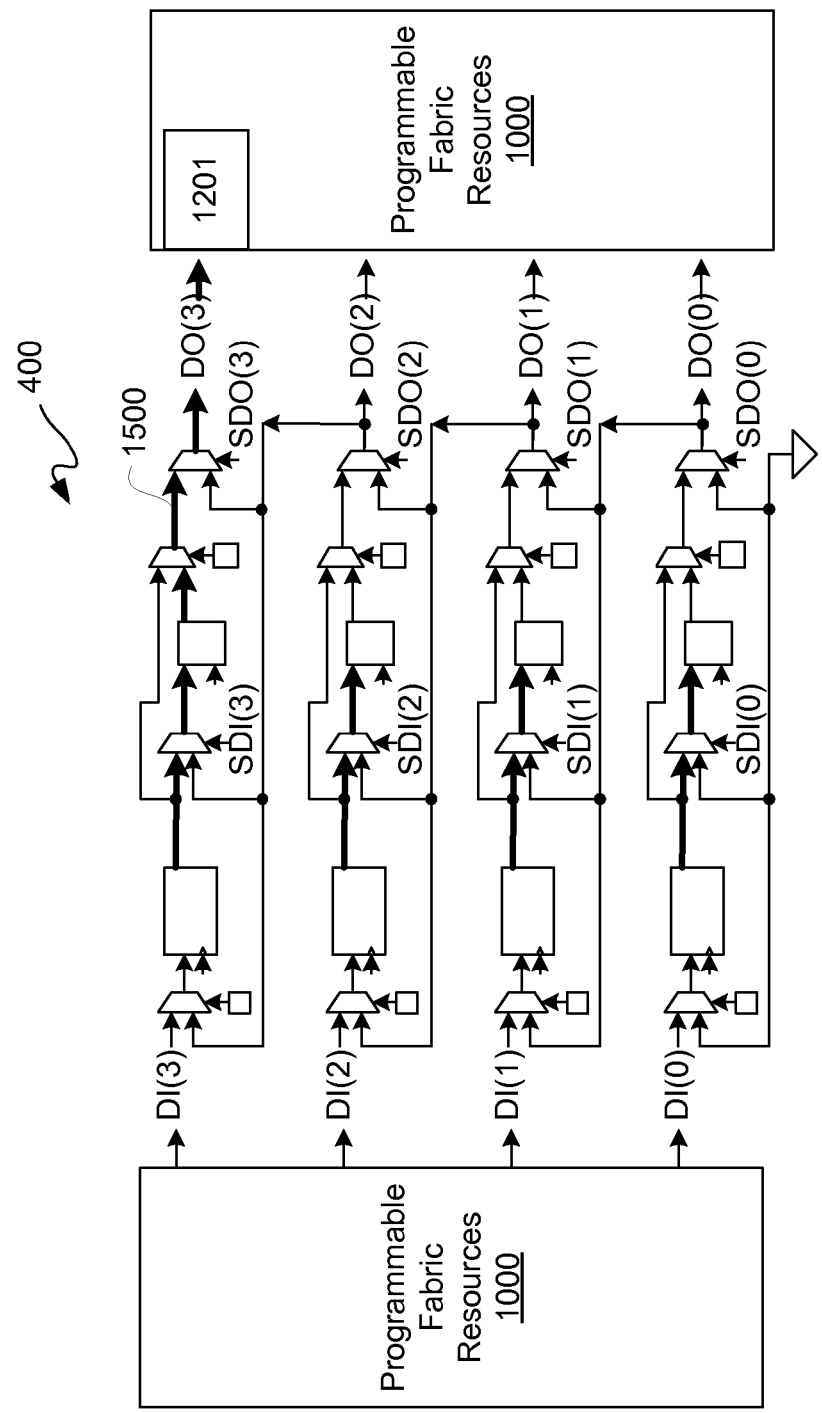
FIG. 15 is the block/circuit diagram of FIG. 10 depicting an exemplary double data rate/vector memory mode ("vector mode") having a data path as generally indicated with thick black lines.

FIG. 15 is the block/circuit diagram of FIG. 10 depicting an exemplary double data rate/vector memory mode ("vector mode") having a data path 1500 as generally indicated with thick black lines. Only one BRAM module 250 is active at a time for outputting data from stack 400, which in the example illustratively depicted is BRAM module 250-3; however, any BRAM module 250 may be active at a time. By having only one BRAM module active at a time, power consumption may be reduced.

This is vector output may be any DO(x), and thus may look like a double data rate ("DDR") burst access, such as a DDR3 burst access for example. In a vector mode, each BRAM block 313 in stack 400 may be randomly accessed. A vector mode may be performed at a high frequency of operation. Though each BRAM block 313 may be read in random order, only one BRAM block 313 may be read per vector. However a vector output shift may appear to be a sequential access. Furthermore, each BRAM block 313 read address may be random and independent from other BRAM read addresses. For a vector mode, both SDI(x) an SDO(x) dynamic control signals may be used.

Figure 16:
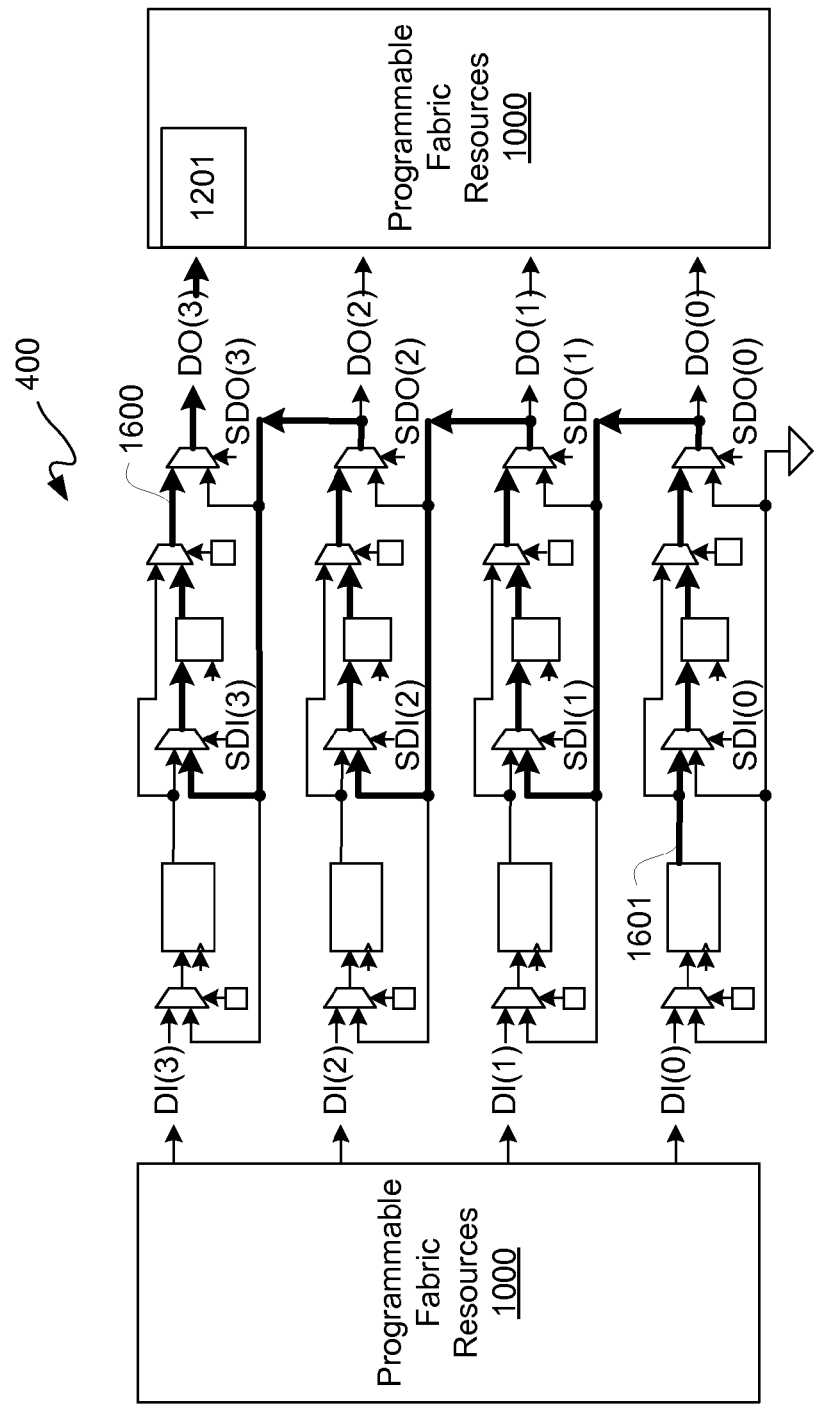
FIG. 16 is the block/circuit diagram of FIG. 10 depicting another exemplary vector mode, namely a "load vector mode," having a data path as generally indicated with thick black lines.

FIG. 16 is the block/circuit diagram of FIG. 10 depicting another exemplary vector mode, namely a "load vector mode," having a data path 1600 as generally indicated with thick black lines. In a load vector mode, an initial portion 1601 of data path 1600 is used to load data from a lowermost BRAM block 313 used, such as BRAM block 313 of BRAM module 250-0 in this example, for loading a register 335 of such lowermost BRAM block. After which, such data may be cascaded through intervening registers to an uppermost register 335 of a stack 400. Along those lines, a next address in a lowermost BRAM block 313 may be read to provide read data for filling a pipeline formed of cascaded registers 335. From a register 335 of an uppermost BRAM module, such as BRAM module 250-3 for example, data DO(0) may be output from such stack 400 as DO(3) for input to a register 1201 of programmable fabric resources 1000 for example.

Figures 1, 17:
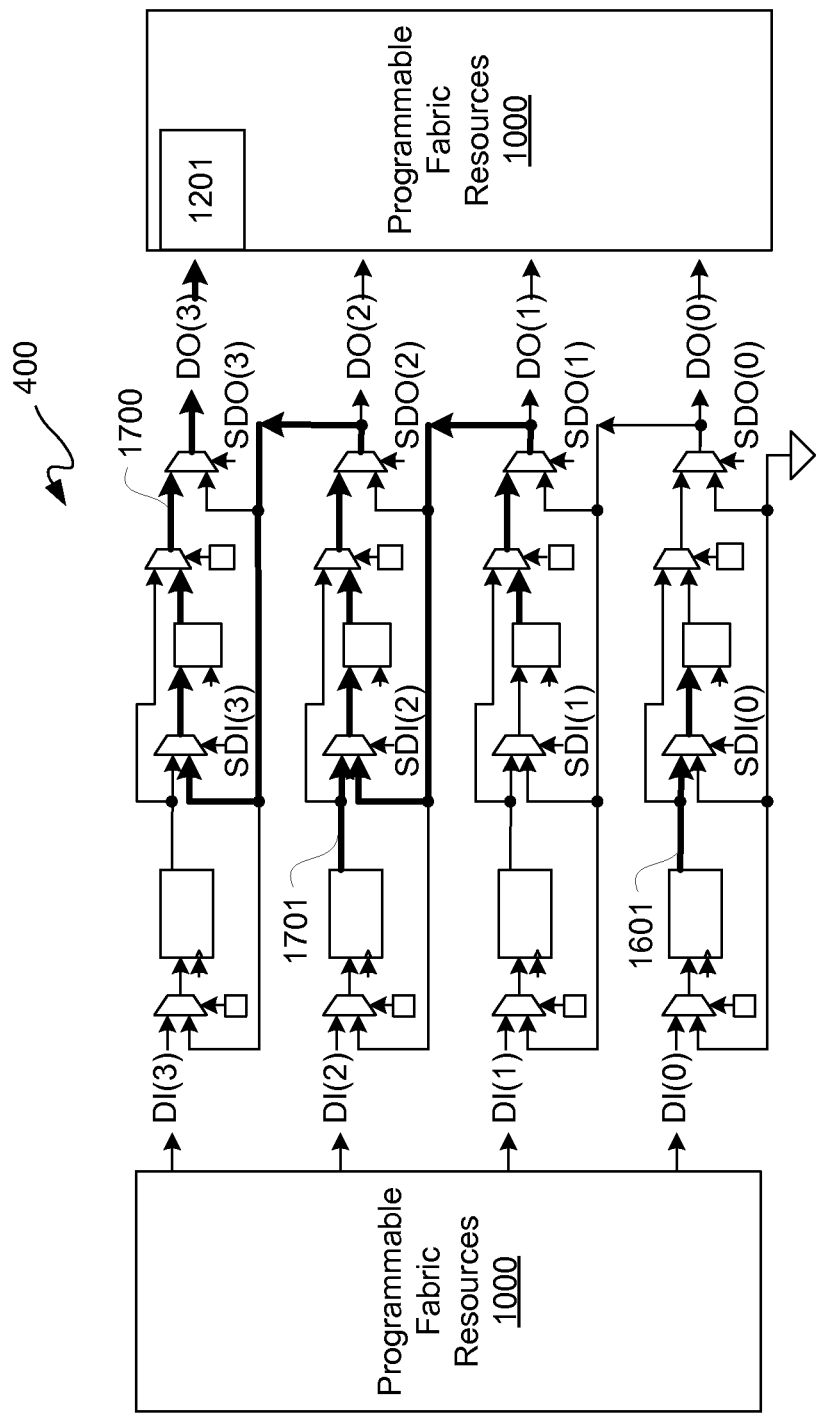
Figures 2, 17:
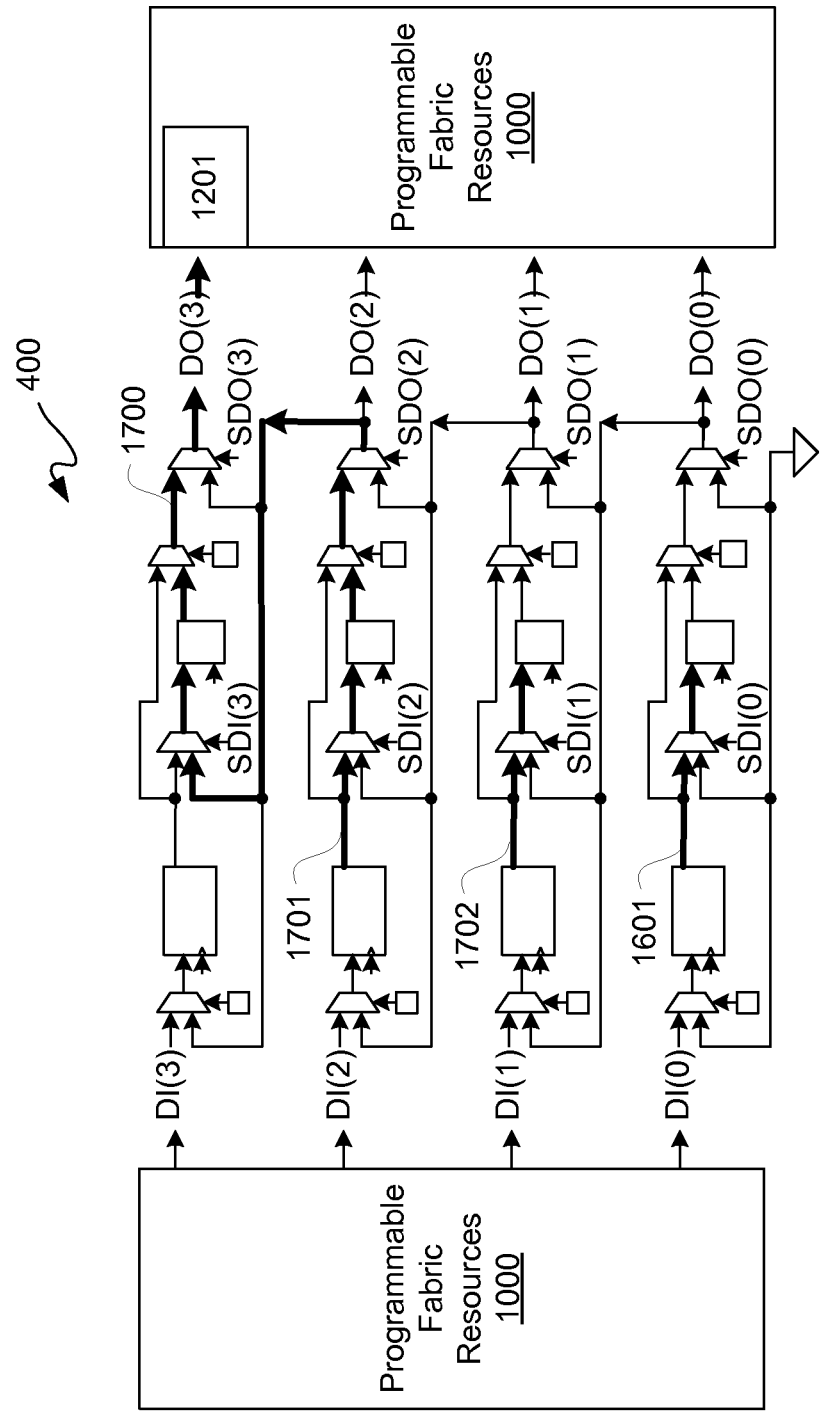

FIG. 17-1 is the block/circuit diagram of FIG. 10 depicting another exemplary vector mode, namely a "shift vector mode," having a data path 1700 as generally indicated with thick black lines. Once data DO(0) has been registered in upper-level register, a user may wish to have other data shifted in or inserted. In this example, another initial path 1701 is added for shifting in DI(2) into the cascaded pipelined path. Along those lines, a BRAM block 313 of BRAM module 250-2 may have data read out at a next address applied thereto. After which, such data may be cascaded through intervening registers to an uppermost register 335 of a stack 400. Along those lines, a next address in an intervening BRAM block 313 may be read to provide read data for inserting such data into a pipeline formed of cascaded registers 335. From a register 335 of an uppermost BRAM module, such as BRAM module 250-3 for example, data DO(2) may be output from such stack 400 as DO(3) for input to a register 1201 of programmable fabric resources 1000 for example.

FIG. 17-2 is the block/circuit diagram of FIG. 17-1 depicting another configuration for a shift vector mode for a data path 1700 as generally indicated with thick black lines. In this example, a BRAM block 313 of a BRAM module 250-1 is used to shift in data as generally indicated by initial path 1702. This is to illustrate that such data may be shifted in from any intervening BRAM block 313 in stack 400.

Figure 18:
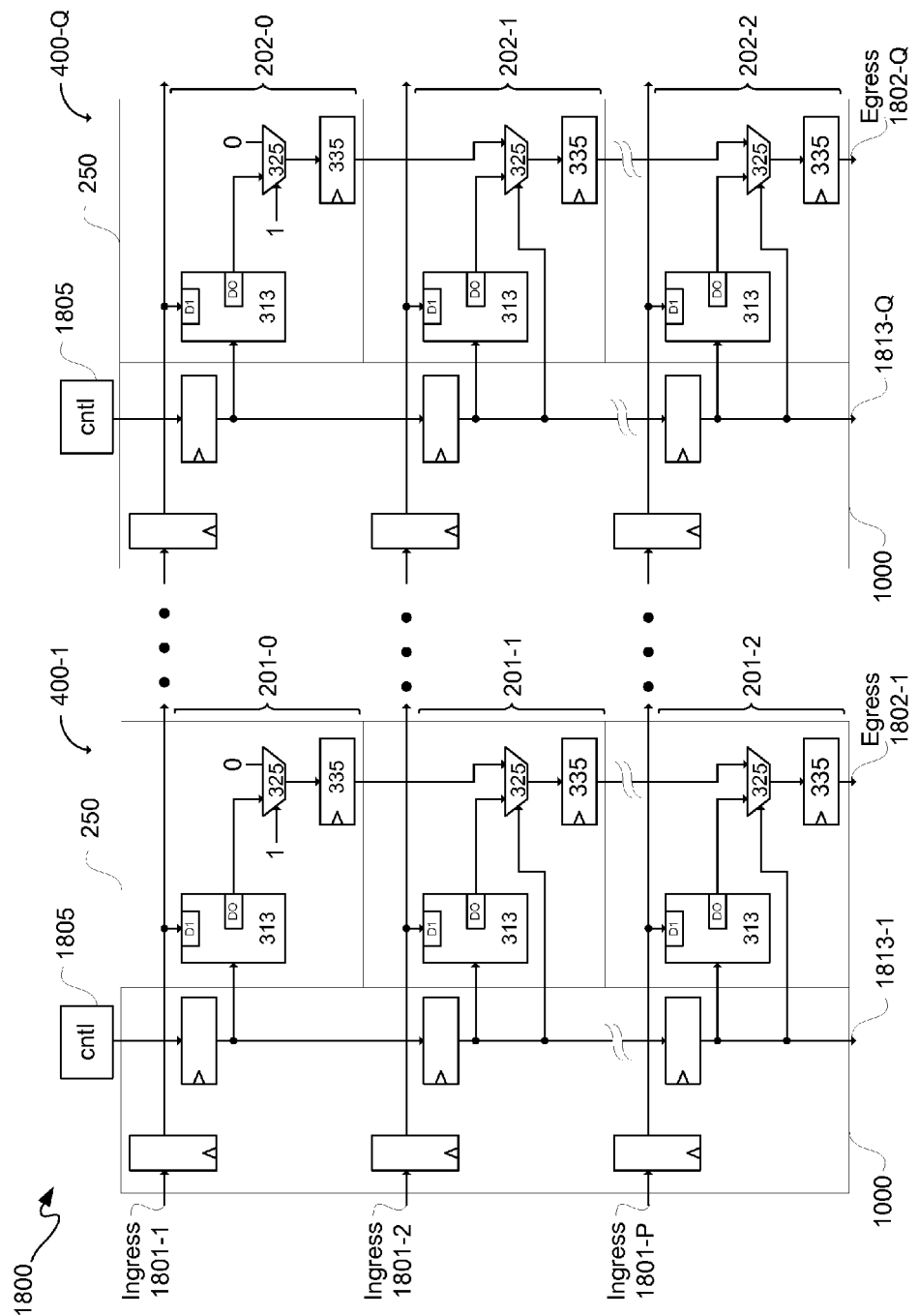
FIG. 18 is a block/circuit diagram depicting an exemplary two-dimensional array systolic switch.

FIG. 18 is a block/circuit diagram depicting an exemplary two-dimensional array systolic switch 1800. Systolic switch 1800 may be for a Common Public Radio Interface ("CPRI"). Systolic switch 1800 may be formed of a plurality of stacks 400-1 through 400-Q, for Q a positive integer greater than one. Ingress pipelines 1801-1 through 1801-P, for P a positive integer greater than one, and control pipelines 1813-1 through 1813-Q may be formed of registers in programmable fabric resources 1000. In this Control pipelines 1813 may be to pipe in control information from control blocks 1805 respectively to BRAM blocks 313 of stacks 400. Ingress pipelines 1801 may be to pipe corresponding in ingress information to respective BRAM blocks 313 of stacks 400. Even though only three ingress pipelines 1801 are illustratively depicted in detail, many more than three ingress pipelines 1801 may be formed. Again, each of stacks 400 may be formed of a plurality of block RAM modules 250. Stacks 400 may be composed of all upper, all lower, or a combination of upper and lower memory blocks 201 and/or 202.

An initial BRAM module of each of stacks 400 may have a multiplexer 325 having an input which is not used. Accordingly, a select signal provided to such multiplexer 325 may be a static signal; likewise, another static signal may be provided to such unused data input. Data output from a BRAM block 313 of such initial BRAM module 250-0 is provided as an input to such multiplexer 325 for output therefrom.

Multiplexers 325, other than initial multiplexers 325, may be coupled to a control pipeline of pipelines 1813 to obtain control select signals for selecting output. Output from such other multiplexers 325 may be selected as being either cascaded input data from a nearest neighbor lower-level BRAM module 250 or read data from a BRAM block 313 of a current BRAM module 250 level in which such multiplexer 325 resides. BRAM blocks 313 may be coupled to control pipeline to receive address and other information therefrom. Output from multiplexers 325 may be respectively provided to registers 335 to form a vertical pipeline.

Accordingly, vertical pipelines may be provided as hard macros using stacks 400 in order to increase frequency of operation significantly above that available in programmable resource fabric. Egress information may be output from hard macro egress vertical pipelines 1802-1 through 1802-Q.

When cascading FIFO's, such as using a stack 400 or multiple stacks 400, to increase depth, an initial one of such FIFOs, namely a FIFO with a write interface, may be identified with a cascade order signal of "first". Likewise, a last one of such FIFOs, namely a FIFO with a read interface, may be identified with a cascade order signal of "last." All interim FIFOs in a chain FIFOs may be identified with a cascade order of "middle" or "interim." Along those lines, "first," "middle", or "last" is effectively a cascade order parameter to controls multiplexers in each FIFO to determine whether to use normal write inputs or cascaded outputs ("first"), cascaded inputs and outputs ("middle"), or cascaded inputs and normal outputs ("last"). Cascade order parameters are used for purposes of clarity by way of example and not limitation.

Figure 19:
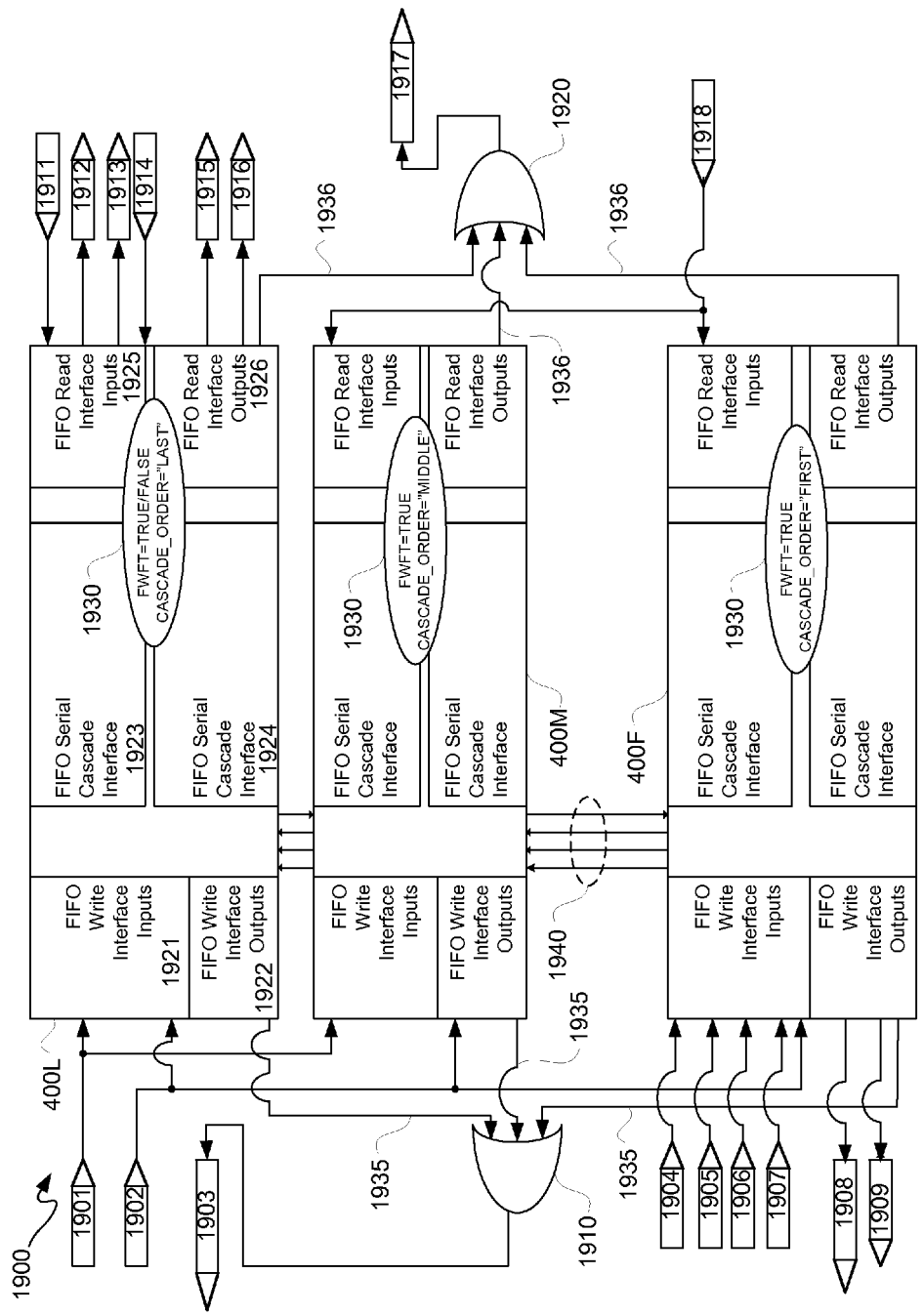
FIG. 19 is a block diagram depicting an exemplary chain of FIFOs ("chain"), which may be formed from a plurality of stacks, for a FIFO cascade mode.

With this understanding borne in mind, FIG. 19 is a block diagram depicting an exemplary chain of FIFOs ("chain") 1900, which may be formed from a plurality of stacks 400, for a FIFO cascade mode. In this example, there is a last stack 400L, a middle stack 400M, and a first stack 400F; however, in other FIFO chain configurations fewer or more than three stacks 400 may be used. Along those lines, for example, an entire column of BRAM modules 250 in an FPGA may be coupled to one another to provide a single FIFO chain. Even though single instances of signal lines are illustratively depicted for purposes of clarity and not limitation, some signals may include multiple signal lines. Particularly, data input, data input parity, data output, and data output parity types of signals may involve multiple signal lines. Chain 1900 may be configured for use in a registered or unregistered mode, to use common or independent clock domains, to have a write clock that is faster than a read clock, and/or to have a read clock that is faster than a write clock.

Each stack 400 includes a FIFO write input interface 1921 for write inputs, a FIFO write output interface 1922 for write outputs, a FIFO serial cascade interface 1923, a FIFO serial cascade interface 1924, a FIFO read interface 1925 for read inputs, and a FIFO read interface 1926 for read outputs. Each stack or FIFO 400 may include a state or attribute setting ("states") 1930. States 1930 for FIFOs 400 having a cascade order of first or middle may be configured with a "first word fall through" ("FWFT") set to "true." Generally, an FWFT FIFO is one in which data written to an empty FIFO appears on a read port before or concurrent with any non-empty indication, or a read enable may be asserted to read first data from what was an empty FIFO. Additional information regarding FIFO operation may be found in additional detail in U.S. Pat. Nos. 6,847,558, 6,848,042, and 7,535,789. States 1930 for a FIFO 400 having a cascade order of last may be configured with a FWFT set to "false." With states 1930 set, serial cascade interfacing of FIFOs 400 may automatically be connected as shown by each such FIFO's controller logic, namely such FIFO controller logic takes care of handshaking between FIFO's and all write and read interface outputs.

A user may provide a write clock signal for a first FIFO 400 and a read clock signal for a last FIFO 400 in a chain 1900. Middle FIFO's 400 may have write and read clock signals tied to an internal clock signal, where such internal clock signal is faster than such read and write clock signals. If both read and write clock signals of a FIFO 400 are tied to a same clock input source, such FIFO 400 may be configured as a synchronous FIFO, which may reduce latencies.

With respect to FIFO write input interface 1921 input ports, an internal clock 1901 may be provided to a write clock port of each of FIFOs 400L and 400M. A write reset signal 1902 may be provided to a write reset port of each of FIFOs 400L, 400M and 400F. A write clock signal 1904 may be provided to a write clock port of FIFO 400F. A data-in bus 1905 and a data-in parity bus 1906 may respectively be provided to data-in and data-in parity ports of FIFO 400F. A write enable signal 1907 may be provided to a write enable port of FIFO 400F.

With respect to FIFO write output interface 1922 output ports, a write reset busy signal 1935 may be sent from each of FIFOs 400L, 400M and 400F to an OR gate 1910. Output of OR gate 1910 may thus be a write reset busy signal 1903 indicating whether all FIFOs of chain 1900 have been reset for a write. Along those lines, for a static number of FIFOs 400, OR gate 1910 may be provided as part of a hard macro. However, by allowing a user to select how long a chain 1900 may be, OR gate 1910 may be formed using programmable fabric resources 1000. A write error signal 1908 and a full signal 1909 may be respectively sourced from a write error port and a full port of FIFO 400F. In this example, OR gates 1910 and 1920 are used for an active low configuration. In another example, NOR gates may be used for gates 1910 and 1920 for an active high configuration.

Between FIFOs 400 may be control signals 1940. Control signals 1940 may include a data-out next signal, a data-out parity next signal, and an empty next signal which may be provided from a lower order FIFO serial cascade interface 1923 up to a corresponding data-in previous port, data-in parity previous port, and empty previous port of a nearest neighbor higher order FIFO serial cascade interface 1924. Control signals 1940 may further include a read enable previous signal which may be provided from a higher order FIFO serial cascade interface 1924 down to a corresponding read enable next port of a nearest neighbor lower order FIFO serial cascade interface 1923.

With respect to FIFO read input interface 1925 input ports, a read clock signal 1911 and a read enable signal 1914 may respectively be provided to a read clock port and a read enable port of FIFO 400L. A data-out signal 1912 and a data-out parity signal 1913 may respectively be sourced from associated ports of FIFO 400L. An internal clock signal 1918 may be provided to a read clock port of each middle FIFO 400M and a first FIFO 400F.

With respect to FIFO read output interface 1926 output ports, a read reset busy signal 1936 may be sent from each of FIFOs 400L, 400M and 400F to an OR gate 1920. Output of OR gate 1920 may thus be a read reset busy signal 1917 indicating whether all FIFOs of chain 1900 have been reset for a read. Along those lines, for a static number of FIFOs 400, OR gate 1920 may be provided as part of a hard macro. However, by allowing a user to select how long a chain 1900 may be, OR gate 1920 may be formed using programmable fabric resources 1000. A read error signal 1915 and an empty signal 1916 may be respectively sourced from a read error port and an empty port of FIFO 400L.

Accordingly, a last FIFO 400L in a chain 1900 may output an empty signal 1916, when all FIFOs 400 in such chain 1900 are empty. Furthermore, a first FIFO 400F in a chain 1900 may output a full signal 1908 when all FIFOs 400 in such chain 1900 are full. Furthermore, it should be appreciated that routing between FIFOs 400 may be entirely within a hard macro provided by memory system 200, which avoids having to concatenate FIFOs using programmable fabric resources.

Figure 20:
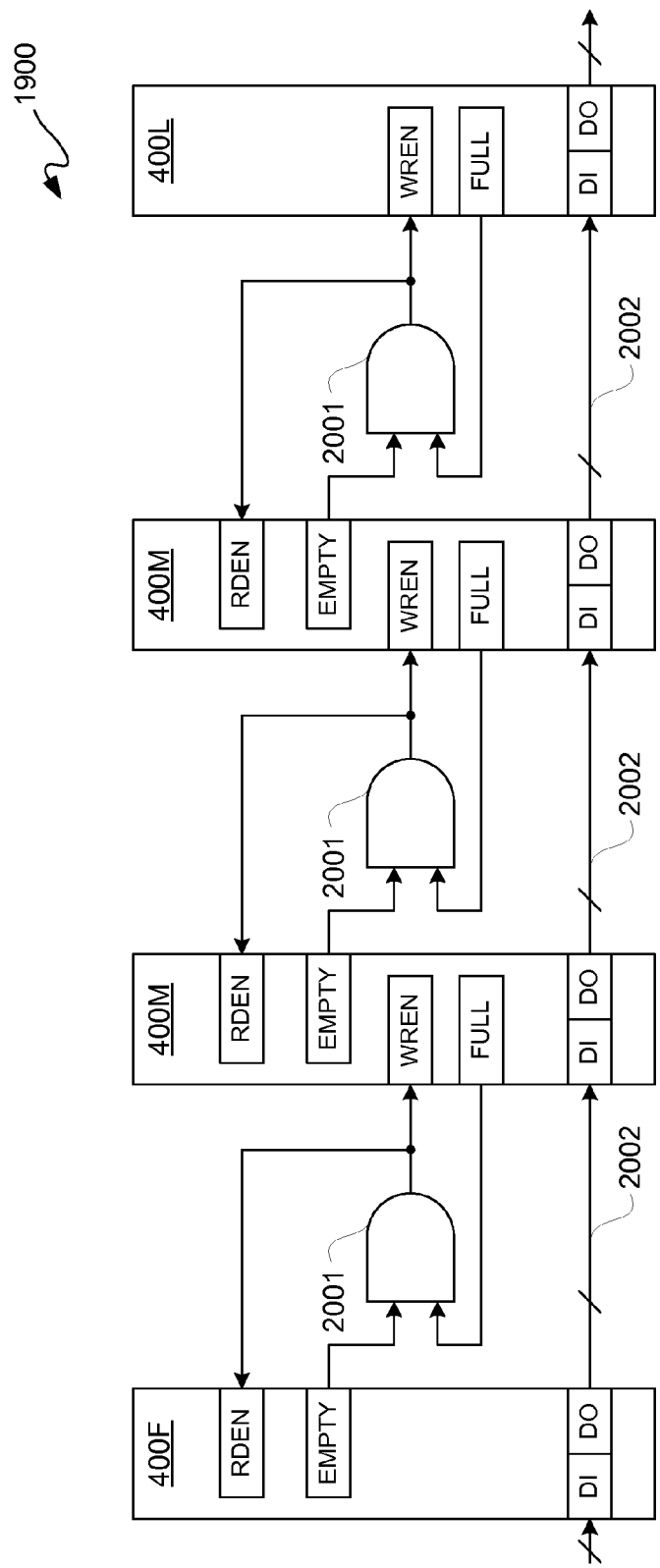
FIG. 20 is a block diagram depicting another exemplary chain of FIFOs, which may be formed from a plurality of stacks, for a FIFO cascade mode.

FIG. 20 is a block diagram depicting another exemplary chain of FIFOs 1900, which may be formed from a plurality of stacks 400, for a FIFO cascade mode. For interconnecting control status between any two nearest neighbor FIFOs 400, a respective AND gate 2001 may be provided as part of a hard macro of memory system 200 to reduce congestion, improve performance, and/or ease timing. An AND gate 2001 may have an input coupled to an empty port of a lower order FIFO 400, such as a FIFO 400F or 400M, and another input coupled to a full port of a nearest neighbor higher order FIFO 400, such as a FIFO 400M or 400L. Full and empty signals in this example are active low. In an example where fully and empty signals are active high, AND gates 2001 may be respectively replaced with NOR gates. Output of AND gate 2001 may be coupled to a write enable port of such nearest neighbor higher order FIFO 400 and to a read enable port of such lower order FIFO 400. Furthermore, for interconnecting data between any two nearest neighbor FIFOs 400 of chain 1900, dedicated data routing 2002, including without limitation data parity routing, may be provided as part of a hard macro of memory system 200 to reduce congestion, improve performance, and/or ease timing.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. An apparatus, comprising:
   a memory module, wherein the memory module is a reconfigurable hard macro and a first portion of the memory module comprises:
   a data input multiplexer coupled to select between cascaded data and direct/bused data;
   a memory coupled to receive output from the data input multiplexer for storage therein;
   a register input multiplexer coupled to select between read data from the memory and the cascaded data;
   a register coupled to receive output from the register input multiplexer;
   a latch/register mode multiplexer coupled to select between the read data from the memory and registered data from the register; and
   a data output multiplexer coupled to select between the cascaded data and output from the latch/register mode multiplexer to provide output data.

2. The apparatus, according to claim 1, wherein:
   a second portion of the memory module is a copy of the first portion of the memory module;
   the first portion of the memory module is for a first portion of an output bus of the memory module; and
   the second portion of the memory module is for a second portion of an output bus of the memory module.

3. An apparatus, comprising:
   a memory module, wherein the memory module is a configurable hard macro and the memory module comprises:
   a plurality of data-in multiplexers each having a data-in input port, a first cascade input port, a cascade/data-in select port, and a write data output port;
   a plurality of memory blocks each having a write data input port, a first clock port, and a read data output port;
   a plurality of pipeline multiplexers each having a first read data input port, a second cascade input port, a pipeline select port, and a register data output port;
   a plurality of registers each having a register data input port, a registered data output port, and a second clock port;
   a plurality of data-out multiplexers each having a second read data input port, a registered data input port, a registered/unregistered select port, and a block output port; and
   a plurality of control multiplexers each having a third cascade input port, a block input port, a control select port, and a data-output port, wherein the first cascade input port, the second cascade input port, and the third cascade input port are commonly coupled forming a first and a second cascade input node respectively, the block input port of the first and second portion is coupled to receive output from the block output port of the first and second portion respectively, the first read data input port and the second read data input port of each of the first and second portions are commonly coupled to receive output from the read data output port of the first and second portion respectively.

4. The apparatus according to claim 3, wherein:
   the registered data input port of the first and second portion is coupled to receive output from the registered data output port of the first and second portion respectively,
   the register data input port of the first and second portion is coupled to receive output from the register data output port of the first and second portion respectively, and
   the write data input port of the first and second portion is coupled to receive output from the write data output port of the first and second portion respectively.

5. The apparatus according to claim 3, wherein:
   a first of the plurality of control multiplexers has the data-out port thereof being a first portion of an output bus of the memory module; and a second of the plurality of control multiplexers has the data-out port thereof being a second portion of the output bus of the memory module.

6. The apparatus according to claim 5, wherein:
the first portion of the output bus is an upper portion of the output bus; and
the second portion of the output bus is a lower portion of the output bus.

7. The apparatus according to claim 3, wherein
the cascade/data-in select port of the plurality of data-in multiplexers are respectively coupled to first configuration memory cells; and
the registered/unregistered select port of the plurality of data-out multiplexers are respectively coupled to second configuration memory cells.

8. An apparatus, comprising:
a stack of memory modules comprising a first and a second memory module, wherein:
each of the first and second memory modules is a reconfigurable hard macro and the first memory module is at a higher level of a the stack than the second memory module;
a cascade input node of a first upper memory block of the first memory module is coupled to a data-out node of the second upper memory block of the second memory module to provide a first memory column including the first upper memory block and the second upper memory block;
a cascade input node of the first lower memory block of the first memory module is coupled to a data-out node of a second lower memory block of the second memory module to provide a second column including the first lower memory blck and the second lower memory block;
each upper and lower memory block comprises:
  a data-in multiplexer having a data-in input port, a first cascade input port, a cascade/data-in select port, and a write data output port;
  a memory block having a write data input port, a first clock port, and a read data output port;
  a pipeline multiplexer having a first read data input port, a second cascade input port, a pipeline select port, and a register data output port;
  a register having a register data input port, a registered data output port, and a second clock port;
  a data-out multiplexer having a second read data input port, a registered data input port, a registered/unregistered select port, and a block output port; and
  a control multiplexer having a third cascade input port, a block input port, a control select port, and a data-out node, wherein the first cascade input port, the second cascade input port, and the third cascade input port are commonly coupled forming a cascade input node, the block input port is coupled to receive output from the block output port, and the first read data input port and the second read data input port are commonly coupled to receive output from the read data output port.

9. The apparatus according to claim 8, wherein:
the registered data input port is coupled to receive output from the registered data output port,
the register data input port is coupled to receive output from the register data output port, and
the write data input port is coupled to receive output from the write data output port.

10. The apparatus according to claim 8, wherein
the cascade/data-in select port of each of the upper and lower memory blocks is respectively coupled to a first configuration memory cell; and
the registered/unregistered select port of each of the upper and lower memory blocks is respectively coupled to second configuration memory cells.

11. The apparatus according to claim 8, wherein:
a block output port of the first upper memory block is for a first portion of an output bus of the first memory module; and
a block output port of the first lower memory block is for a second portion of the output bus of the first memory module.

12. The apparatus according to claim 11, wherein:
a block output port of the second upper memory block is for a first portion of an output bus of the second memory module; and
a block output port of the second lower memory block is for a second portion of the output bus of the second memory module.

13. The apparatus according to claim 8, wherein:
the data-out node of the first upper memory block and the data-out node of the second upper memory block in combination provide a bus output: and
the combination is of the first portion of the output bus of the first memory module and the first portion of the output bus of the second memory module.

14. The apparatus according to claim 8, wherein:
the first upper memory block and the second upper memory block are coupled to a first write address bus and a first read address bus; and
the first lower memory block and the second lower memory block are coupled to a second write address bus and a second read address bus.

15. The apparatus according to claim 8, wherein:
the first memory module and the second memory module in combination are configurable for any of a plurality of modes; and
the plurality of modes is selected from a group consisting of a cascade mode and a memory mode.

16. The apparatus according to claim 8, wherein the cascade mode is selected from a group consisting of a one hot cascade mode, a pipelined cascade mode, a systolic write cascade mode, a first-in, first-out buffer cascade mode, a registered cascade mode, and a latch cascade mode.

17. The apparatus according to claim 16, wherein the memory mode is selected from a group consisting of a vector mode and a shift vector mode.

* * * * *